United States Patent
Shaw et al.

(10) Patent No.: US 9,509,351 B2
(45) Date of Patent: Nov. 29, 2016

(54) SIMULTANEOUS ACCOMMODATION OF A LOW POWER SIGNAL AND AN INTERFERING SIGNAL IN A RADIO FREQUENCY (RF) RECEIVER

(75) Inventors: Michael Joseph Shaw, Granite Bay, CA (US); Jonathan Lee Kennedy, Grass Valley, CA (US); Darrell Lee Livezey, Auburn, CA (US); Joy Laskar, Los Altos, CA (US)

(73) Assignee: TAHOE RF SEMICONDUCTOR, INC., Auburn, CA (US)

( * ) Notice: Subject to any disclaimer, the term of this patent is extended or adjusted under 35 U.S.C. 154(b) by 586 days.

(21) Appl. No.: 13/559,745

(22) Filed: Jul. 27, 2012

(65) Prior Publication Data
US 2014/0030981 A1    Jan. 30, 2014

(51) Int. Cl.
*H04B 15/00* (2006.01)
*H04B 1/10* (2006.01)
(Continued)

(52) U.S. Cl.
CPC . *H04B 1/10* (2013.01); *H03L 7/06* (2013.01); *H04B 1/0028* (2013.01); *H04B 1/28* (2013.01)

(58) Field of Classification Search
CPC .......... H04B 1/10; H04B 15/00; H04B 1/06; H04B 1/1018; H04B 15/06; H04B 1/0028; H04B 1/036; H04B 1/1027; H04B 1/109; H04B 7/08; H04B 1/0042; H04B 1/005; H04B 1/0085
USPC .................... 455/631, 296, 234.1, 63.1, 130
See application file for complete search history.

(56) References Cited

U.S. PATENT DOCUMENTS 2,087,767 A    7/1937    Schermer
2,349,976 A    5/1944    Matsudaira
(Continued)

FOREIGN PATENT DOCUMENTS

CA    2255347 A1    6/1999
CA    2340716 A1    3/2000
(Continued)

OTHER PUBLICATIONS

Raben H., WiMAX/LTE Receiver Front-End in 90nm CMOS, www.diva-portal.org/smash/get/diva2:277389/FULLTEXT01.pdf,2009, pp. 1-90.*

(Continued)

*Primary Examiner* — Nay A Maung
*Assistant Examiner* — Angelica M Perez
(74) *Attorney, Agent, or Firm* — Raj Abhyanker

(57) ABSTRACT

A method includes providing a highly linear front end in a Radio Frequency (RF) receiver, implementing a high Effective Number of Bits (ENOB) Analog to Digital Converter (ADC) circuit in the RF receiver, and sampling, through the high ENOB ADC circuit, at a frequency having harmonics that do not coincide with a desired signal component of an input signal of the RF receiver to eliminate spurs within a data bandwidth of the RF receiver. The input signal includes the desired signal component and an interference signal component. The interference signal component has a higher power level than the desired signal component. The method also includes simultaneously accommodating the desired signal component and the interference signal component in the RF receiver based on an increased dynamic range of the RF receiver and the high ENOB ADC circuit provided through the highly linear front end and the high ENOB ADC circuit.

23 Claims, 10 Drawing Sheets

(51) Int. Cl.
*H04B 1/00* (2006.01)
*H04B 1/28* (2006.01)
*H03L 7/06* (2006.01)

(56) References Cited

U.S. PATENT DOCUMENTS

| | | |
|---|---|---|
| 2,810,906 A | 10/1957 | Lynch |
| 2,904,674 A | 9/1959 | Crawford |
| 3,036,211 A | 5/1962 | Broadhead, Jr. et al. |
| 3,193,767 A | 7/1965 | Schultz |
| 3,305,864 A | 2/1967 | Ghose |
| 3,328,714 A | 6/1967 | Hugenholtz |
| 3,344,355 A | 9/1967 | Massman |
| 3,422,436 A | 1/1969 | Marston |
| 3,422,437 A | 1/1969 | Marston |
| 3,433,960 A | 3/1969 | Minott |
| 3,460,145 A | 8/1969 | Johnson |
| 3,500,411 A | 3/1970 | Kiesling |
| 3,619,786 A | 11/1971 | Wilcox |
| 3,680,112 A | 7/1972 | Thomas |
| 3,754,257 A | 8/1973 | Coleman |
| 3,803,618 A | 4/1974 | Coleman |
| 3,838,423 A | 9/1974 | Di Matteo |
| 3,996,592 A | 12/1976 | Kline et al. |
| 4,001,691 A | 1/1977 | Gruenberg |
| 4,017,867 A | 4/1977 | Claus |
| 4,032,922 A | 6/1977 | Provencher |
| 4,090,199 A | 5/1978 | Archer |
| 4,112,430 A | 9/1978 | Ladstatter |
| 4,148,031 A | 4/1979 | Fletcher et al. |
| 4,188,578 A | 2/1980 | Reudink et al. |
| 4,189,733 A | 2/1980 | Malm |
| 4,214,244 A | 7/1980 | McKay et al. |
| 4,233,606 A | 11/1980 | Lovelace et al. |
| 4,270,222 A | 5/1981 | Menant |
| 4,277,787 A | 7/1981 | King |
| 4,315,262 A | 2/1982 | Acampora et al. |
| 4,404,563 A | 9/1983 | Richardson |
| 4,532,519 A | 7/1985 | Rudish et al. |
| 4,544,927 A | 10/1985 | Kurth et al. |
| 4,566,013 A | 1/1986 | Steinberg et al. |
| 4,649,373 A | 3/1987 | Bland et al. |
| 4,688,045 A | 8/1987 | Knudsen |
| 4,698,748 A | 10/1987 | Juzswik et al. |
| 4,722,083 A | 1/1988 | Tirro et al. |
| 4,736,463 A | 4/1988 | Chavez |
| 4,743,783 A | 5/1988 | Isbell et al. |
| 4,772,893 A | 9/1988 | Iwasaki |
| 4,792,991 A | 12/1988 | Eness |
| 4,806,938 A | 2/1989 | Meadows |
| 4,827,268 A | 5/1989 | Rosen |
| 4,882,589 A | 11/1989 | Reisenfeld |
| 4,901,085 A | 2/1990 | Spring et al. |
| 4,956,643 A | 9/1990 | Hahn, III et al. |
| 4,965,602 A | 10/1990 | Kahrilas et al. |
| 5,001,776 A | 3/1991 | Clark |
| 5,012,254 A | 4/1991 | Thompson |
| 5,027,126 A | 6/1991 | Basehgi et al. |
| 5,028,931 A | 7/1991 | Ward |
| 5,034,752 A | 7/1991 | Pourailly et al. |
| 5,041,836 A | 8/1991 | Paschen et al. |
| 5,084,708 A | 1/1992 | Champeau et al. |
| 5,093,668 A | 3/1992 | Sreenivas |
| 5,107,273 A | 4/1992 | Roberts |
| 5,128,687 A | 7/1992 | Fay |
| 5,166,690 A | 11/1992 | Carlson et al. |
| 5,173,701 A | 12/1992 | Dijkstra |
| 5,179,724 A | 1/1993 | Lindoff |
| 5,243,415 A | 9/1993 | Vance |
| 5,274,836 A | 12/1993 | Lux |
| 5,276,449 A | 1/1994 | Walsh |
| 5,347,546 A | 9/1994 | Abadi et al. |
| 5,349,688 A | 9/1994 | Nguyen |
| 5,359,329 A | 10/1994 | Lewis et al. |
| 5,369,771 A | 11/1994 | Gettel |
| 5,375,146 A | 12/1994 | Chalmers |
| 5,396,635 A | 3/1995 | Fung |
| 5,408,668 A | 4/1995 | Tornai |
| 5,434,578 A | 7/1995 | Stehlik |
| 5,457,365 A | 10/1995 | Blagaila et al. |
| 5,481,570 A | 1/1996 | Winters |
| 5,486,726 A | 1/1996 | Kim et al. |
| 5,497,162 A | 3/1996 | Kaiser |
| 5,523,764 A | 6/1996 | Martinez et al. |
| 5,539,415 A | 7/1996 | Metzen et al. |
| 5,560,020 A | 9/1996 | Nakatani et al. |
| 5,560,024 A | 9/1996 | Harper et al. |
| 5,564,094 A | 10/1996 | Anderson et al. |
| 5,583,511 A | 12/1996 | Hulderman |
| 5,592,178 A | 1/1997 | Chang et al. |
| 5,594,460 A | 1/1997 | Eguchi |
| 5,617,572 A | 4/1997 | Pearce et al. |
| 5,666,365 A | 9/1997 | Kostreski |
| 5,697,081 A | 12/1997 | Lyall, Jr. et al. |
| 5,710,929 A | 1/1998 | Fung |
| 5,712,641 A | 1/1998 | Casabona et al. |
| 5,748,048 A | 5/1998 | Moyal |
| 5,754,138 A | 5/1998 | Turcotte et al. |
| 5,787,294 A | 7/1998 | Evoy |
| 5,790,070 A | 8/1998 | Natarajan et al. |
| 5,799,199 A | 8/1998 | Ito et al. |
| 5,822,597 A | 10/1998 | Kawano et al. |
| 5,867,063 A | 2/1999 | Snider et al. |
| 5,869,970 A | 2/1999 | Palm et al. |
| 5,870,685 A | 2/1999 | Flynn |
| 5,909,460 A | 6/1999 | Dent |
| 5,952,965 A | 9/1999 | Kowalski |
| 5,959,578 A | 9/1999 | Kreutel, Jr. |
| 5,966,371 A | 10/1999 | Sherman |
| 5,987,614 A | 11/1999 | Mitchell et al. |
| 6,006,336 A | 12/1999 | Watts et al. |
| 6,009,124 A | 12/1999 | Smith et al. |
| 6,026,285 A | 2/2000 | Lyall, Jr. et al. |
| 6,061,385 A | 5/2000 | Ostman |
| 6,079,025 A | 6/2000 | Fung |
| 6,084,540 A | 7/2000 | Yu |
| 6,111,816 A | 8/2000 | Chiang et al. |
| 6,127,815 A | 10/2000 | Wilcox |
| 6,127,971 A | 10/2000 | Calderbank et al. |
| 6,144,705 A | 11/2000 | Papadopoulos et al. |
| 6,166,689 A | 12/2000 | Dickey, Jr. et al. |
| 6,167,286 A | 12/2000 | Ward et al. |
| 6,169,522 B1 | 1/2001 | Ma et al. |
| 6,175,719 B1 | 1/2001 | Sarraf et al. |
| 6,272,317 B1 | 8/2001 | Houston et al. |
| 6,298,221 B1 | 10/2001 | Nguyen |
| 6,317,411 B1 | 11/2001 | Whinnett et al. |
| 6,320,896 B1 | 11/2001 | Jovanovich et al. |
| 6,336,030 B2 | 1/2002 | Houston |
| 6,397,090 B1 | 5/2002 | Cho |
| 6,463,295 B1 | 10/2002 | Yun |
| 6,473,016 B2 | 10/2002 | Piirainen et al. |
| 6,473,037 B2 | 10/2002 | Vail et al. |
| 6,480,522 B1 | 11/2002 | Hoole et al. |
| 6,501,415 B1 | 12/2002 | Viana et al. |
| 6,509,865 B2 | 1/2003 | Takai |
| 6,523,123 B1 | 2/2003 | Barbee |
| 6,529,162 B2 | 3/2003 | Newberg et al. |
| 6,587,077 B2 | 7/2003 | Vail et al. |
| 6,598,009 B2 | 7/2003 | Yang |
| 6,630,905 B1 | 10/2003 | Newberg et al. |
| 6,646,599 B1 | 11/2003 | Apa et al. |
| 6,653,969 B1 | 11/2003 | Birleson |
| 6,661,366 B2 | 12/2003 | Yu |
| 6,661,375 B2 | 12/2003 | Rickett et al. |
| 6,671,227 B2 | 12/2003 | Gilbert et al. |
| 6,697,953 B1 | 2/2004 | Collins |
| 6,707,419 B2 | 3/2004 | Woodington et al. |
| 6,768,456 B1 | 7/2004 | Lalezari et al. |
| 6,771,220 B1 | 8/2004 | Ashe et al. |
| 6,778,137 B2 | 8/2004 | Krikorian et al. |
| 6,788,250 B2 | 9/2004 | Howell |
| 6,816,977 B2 | 11/2004 | Brakmo et al. |
| 6,822,522 B1 | 11/2004 | Brown et al. |

(56) References Cited

U.S. PATENT DOCUMENTS

| | | |
|---|---|---|
| 6,833,766 B2 | 12/2004 | Kim et al. |
| 6,870,503 B2 | 3/2005 | Mohamadi |
| 6,873,289 B2 | 3/2005 | Kwon et al. |
| 6,885,974 B2 | 4/2005 | Holle |
| 6,947,775 B2 | 9/2005 | Okamoto et al. |
| 6,960,962 B2 | 11/2005 | Peterzell et al. |
| 6,977,610 B2 | 12/2005 | Brookner et al. |
| 6,980,786 B1 | 12/2005 | Groe |
| 6,989,787 B2 | 1/2006 | Park et al. |
| 6,992,992 B1 | 1/2006 | Cooper et al. |
| 7,006,039 B2 | 2/2006 | Miyamoto et al. |
| 7,010,330 B1 | 3/2006 | Tsividis |
| 7,013,165 B2 | 3/2006 | Yoon et al. |
| 7,016,654 B1 | 3/2006 | Bugeja |
| 7,035,613 B2 | 4/2006 | Dubash et al. |
| 7,039,442 B1 | 5/2006 | Joham et al. |
| 7,062,302 B2 | 6/2006 | Yamaoka |
| 7,103,383 B2 | 9/2006 | Ito |
| 7,109,918 B1 | 9/2006 | Meadows et al. |
| 7,109,919 B2 | 9/2006 | Howell |
| 7,110,732 B2 | 9/2006 | Mostafa et al. |
| 7,126,542 B2 | 10/2006 | Mohamadi |
| 7,126,554 B2 | 10/2006 | Mohamadi |
| 7,154,346 B2 | 12/2006 | Jaffe et al. |
| 7,196,590 B1 | 3/2007 | In et al. |
| 7,245,269 B2 | 7/2007 | Sievenpiper et al. |
| 7,304,607 B2 | 12/2007 | Miyamoto et al. |
| 7,312,750 B2 | 12/2007 | Mao et al. |
| 7,327,313 B2 | 2/2008 | Hemmi et al. |
| 7,340,623 B2 | 3/2008 | Kato et al. |
| 7,379,515 B2 | 5/2008 | Johnson et al. |
| 7,382,202 B2 | 6/2008 | Jaffe et al. |
| 7,382,314 B2 | 6/2008 | Liao et al. |
| 7,382,743 B1 | 6/2008 | Rao et al. |
| 7,421,591 B2 | 9/2008 | Sultenfuss et al. |
| 7,440,766 B1 | 10/2008 | Tuovinen et al. |
| 7,463,191 B2 | 12/2008 | Dybdal et al. |
| 7,482,975 B2 | 1/2009 | Kimata |
| 7,501,959 B2 | 3/2009 | Shirakawa |
| 7,508,950 B2 | 3/2009 | Danielsen |
| 7,522,885 B2 | 4/2009 | Parssinen et al. |
| 7,529,443 B2 | 5/2009 | Holmstrom et al. |
| 7,558,548 B2 * | 7/2009 | Konchistky ............... 455/190.1 |
| 7,570,124 B2 | 8/2009 | Haralabidis |
| 7,574,617 B2 | 8/2009 | Park |
| 7,620,382 B2 | 11/2009 | Yamamoto |
| 7,663,546 B1 | 2/2010 | Miyamoto et al. |
| 7,664,533 B2 | 2/2010 | Logothetis et al. |
| 7,710,319 B2 | 5/2010 | Nassiri-Toussi et al. |
| 7,728,769 B2 | 6/2010 | Chang et al. |
| 7,742,000 B2 | 6/2010 | Mohamadi |
| 7,760,122 B1 | 7/2010 | Zortea |
| 7,812,775 B2 | 10/2010 | Babakhani et al. |
| 7,848,719 B2 | 12/2010 | Krishnaswamy et al. |
| 7,861,098 B2 | 12/2010 | Theocharous et al. |
| 7,912,517 B2 | 3/2011 | Park |
| 7,925,208 B2 | 4/2011 | Sarraf et al. |
| 7,934,107 B2 | 4/2011 | Walrath |
| 7,944,396 B2 | 5/2011 | Brown et al. |
| 7,979,049 B2 | 7/2011 | Oredsson et al. |
| 7,982,651 B1 * | 7/2011 | Zortea ........................... 341/155 |
| 7,982,669 B2 | 7/2011 | Nassiri-Toussi et al. |
| 7,991,437 B2 | 8/2011 | Camuffo et al. |
| 8,005,437 B2 | 8/2011 | Rofougaran |
| 8,031,019 B2 | 10/2011 | Chawla et al. |
| 8,036,164 B1 | 10/2011 | Winters et al. |
| 8,036,719 B2 | 10/2011 | Ying |
| 8,063,996 B2 | 11/2011 | Du Val et al. |
| 8,072,380 B2 | 12/2011 | Crouch |
| 8,078,110 B2 | 12/2011 | Li et al. |
| 8,102,313 B2 | 1/2012 | Guenther et al. |
| 8,112,646 B2 | 2/2012 | Tsai |
| 8,126,417 B2 | 2/2012 | Saito |
| 8,138,841 B2 | 3/2012 | Wan et al. |
| 8,156,353 B2 | 4/2012 | Tsai |
| 8,165,185 B2 | 4/2012 | Zhang et al. |
| 8,165,543 B2 | 4/2012 | Rohit et al. |
| 8,170,503 B2 | 5/2012 | Oh et al. |
| 8,174,328 B2 | 5/2012 | Park et al. |
| 8,184,052 B1 | 5/2012 | Wu et al. |
| 8,222,933 B2 | 7/2012 | Nagaraj |
| 8,248,203 B2 | 8/2012 | Hanwright et al. |
| 8,265,646 B2 | 9/2012 | Agarwal |
| 8,290,020 B2 * | 10/2012 | Liu et al. ...................... 375/133 |
| 8,305,190 B2 | 11/2012 | Moshfeghi |
| 8,325,089 B2 | 12/2012 | Rofougaran |
| 8,340,015 B1 | 12/2012 | Miller et al. |
| 8,344,943 B2 | 1/2013 | Brown et al. |
| 8,373,510 B2 | 2/2013 | Kelkar |
| 8,396,107 B2 | 3/2013 | Gaur |
| 8,400,356 B2 | 3/2013 | Paynter |
| 8,417,191 B2 | 4/2013 | Xia et al. |
| 8,428,535 B1 | 4/2013 | Cousinard et al. |
| 8,432,805 B2 | 4/2013 | Agarwal |
| 8,446,317 B1 | 5/2013 | Wu et al. |
| 8,456,244 B2 | 6/2013 | Obkircher et al. |
| 8,466,776 B2 | 6/2013 | Fink et al. |
| 8,466,832 B2 | 6/2013 | Afshari et al. |
| 8,472,884 B2 | 6/2013 | Ginsburg et al. |
| 8,509,144 B2 | 8/2013 | Miller et al. |
| 8,542,629 B2 | 9/2013 | Miller |
| 8,558,625 B1 | 10/2013 | Lie et al. |
| 8,565,358 B2 | 10/2013 | Komaili et al. |
| 8,571,127 B2 | 10/2013 | Jiang et al. |
| 8,604,976 B1 | 12/2013 | Chang et al. |
| 8,644,780 B2 | 2/2014 | Tohoku |
| 8,654,262 B2 | 2/2014 | Du Val et al. |
| 8,660,497 B1 | 2/2014 | Zhang et al. |
| 8,660,500 B2 | 2/2014 | Rofougaran et al. |
| 8,700,923 B2 | 4/2014 | Fung |
| 8,761,755 B2 | 6/2014 | Karaoguz |
| 8,762,751 B2 | 6/2014 | Rodriguez et al. |
| 8,781,426 B2 | 7/2014 | Ciccarelli et al. |
| 8,786,376 B2 | 7/2014 | Voinigescu et al. |
| 8,788,103 B2 | 7/2014 | Warren |
| 8,792,896 B2 | 7/2014 | Ahmad et al. |
| 8,797,212 B1 | 8/2014 | Wu et al. |
| 8,805,275 B2 | 8/2014 | O'Neill et al. |
| 8,832,468 B2 | 9/2014 | Pop et al. |
| 8,843,094 B2 | 9/2014 | Ahmed et al. |
| 2001/0038318 A1 | 11/2001 | Johnson et al. |
| 2002/0084934 A1 | 7/2002 | Vail et al. |
| 2002/0159403 A1 | 10/2002 | Reddy |
| 2002/0175859 A1 | 11/2002 | Newberg et al. |
| 2002/0177475 A1 | 11/2002 | Park |
| 2002/0180639 A1 | 12/2002 | Rickett et al. |
| 2003/0003887 A1 | 1/2003 | Lim et al. |
| 2003/0034916 A1 | 2/2003 | Kwon et al. |
| 2004/0043745 A1 | 3/2004 | Najarian et al. |
| 2004/0095287 A1 | 5/2004 | Mohamadi |
| 2004/0166801 A1 | 8/2004 | Sharon et al. |
| 2004/0192376 A1 | 9/2004 | Grybos |
| 2004/0263408 A1 | 12/2004 | Sievenpiper et al. |
| 2005/0012667 A1 | 1/2005 | Noujeim |
| 2005/0030226 A1 | 2/2005 | Miyamoto et al. |
| 2005/0116864 A1 | 6/2005 | Mohamadi |
| 2005/0117720 A1 | 6/2005 | Goodman et al. |
| 2005/0197060 A1 | 9/2005 | Hedinger et al. |
| 2005/0206564 A1 | 9/2005 | Mao et al. |
| 2005/0208919 A1 | 9/2005 | Walker et al. |
| 2005/0215274 A1 | 9/2005 | Matson et al. |
| 2006/0003722 A1 | 1/2006 | Tuttle et al. |
| 2006/0063490 A1 | 3/2006 | Bader et al. |
| 2006/0262013 A1 | 11/2006 | Shiroma et al. |
| 2006/0281430 A1 | 12/2006 | Yamamoto |
| 2007/0047669 A1 * | 3/2007 | Mak et al. .................... 375/316 |
| 2007/0098320 A1 | 5/2007 | Holmstrom et al. |
| 2007/0099588 A1 | 5/2007 | Konchistky |
| 2007/0123186 A1 | 5/2007 | Asayama et al. |
| 2007/0135051 A1 | 6/2007 | Zheng et al. |
| 2007/0142089 A1 | 6/2007 | Roy |
| 2007/0173286 A1 | 7/2007 | Carter et al. |
| 2007/0298742 A1 | 12/2007 | Ketchum et al. |
| 2008/0001812 A1 | 1/2008 | Jalali |

(56) References Cited

U.S. PATENT DOCUMENTS

| | | |
|---|---|---|
| 2008/0039042 A1 | 2/2008 | Ciccarelli et al. |
| 2008/0045153 A1 | 2/2008 | Surineni et al. |
| 2008/0063012 A1 | 3/2008 | Nakao et al. |
| 2008/0075058 A1 | 3/2008 | Mundarath et al. |
| 2008/0091965 A1 | 4/2008 | Nychka et al. |
| 2008/0129393 A1 | 6/2008 | Rangan et al. |
| 2008/0218429 A1 | 9/2008 | Johnson et al. |
| 2008/0233865 A1 | 9/2008 | Malarky et al. |
| 2008/0240031 A1 | 10/2008 | Nassiri-Toussi et al. |
| 2009/0023384 A1 | 1/2009 | Miller |
| 2009/0143038 A1 | 6/2009 | Saito |
| 2009/0153253 A1 | 6/2009 | Mei |
| 2009/0160707 A1 | 6/2009 | Lakkis |
| 2009/0286482 A1 | 11/2009 | Gorokhov et al. |
| 2010/0100751 A1 | 4/2010 | Guo et al. |
| 2010/0259447 A1 | 10/2010 | Crouch |
| 2010/0302980 A1 | 12/2010 | Ji et al. |
| 2011/0084879 A1 | 4/2011 | Brown et al. |
| 2011/0095794 A1 | 4/2011 | Dubost et al. |
| 2011/0140746 A1 | 6/2011 | Park et al. |
| 2011/0188597 A1 | 8/2011 | Agee et al. |
| 2011/0221396 A1 | 9/2011 | Glauning |
| 2011/0235748 A1 | 9/2011 | Kenington |
| 2011/0273210 A1 | 11/2011 | Nagaraj |
| 2011/0285593 A1 | 11/2011 | Cavirani et al. |
| 2012/0004005 A1 | 1/2012 | Ahmed et al. |
| 2012/0013507 A1 | 1/2012 | Fusco |
| 2012/0026970 A1 | 2/2012 | Winters et al. |
| 2012/0092211 A1 | 4/2012 | Hampel et al. |
| 2012/0190378 A1 | 7/2012 | Han et al. |
| 2012/0200327 A1 | 8/2012 | Sreekiran et al. |
| 2012/0235716 A1 | 9/2012 | Dubost et al. |
| 2012/0235857 A1 | 9/2012 | Kim et al. |
| 2012/0280730 A1 | 11/2012 | Obkircher et al. |
| 2012/0284543 A1 | 11/2012 | Xian et al. |
| 2012/0319734 A1 | 12/2012 | Nagaraj et al. |
| 2013/0002472 A1 | 1/2013 | Crouch |
| 2013/0039348 A1 | 2/2013 | Hu et al. |
| 2013/0047017 A1 | 2/2013 | Lin et al. |
| 2013/0095873 A1 | 4/2013 | Soriaga et al. |
| 2013/0154695 A1 | 6/2013 | Abbasi et al. |
| 2013/0176171 A1* | 7/2013 | Webber et al. .......... 342/357.76 |
| 2013/0234889 A1 | 9/2013 | Hwang et al. |
| 2013/0241612 A1 | 9/2013 | Obkircher et al. |
| 2013/0322197 A1 | 12/2013 | Schiller et al. |
| 2013/0339764 A1 | 12/2013 | Lee et al. |
| 2014/0085011 A1 | 3/2014 | Choi et al. |
| 2014/0097986 A1 | 4/2014 | Xue et al. |
| 2014/0120845 A1 | 5/2014 | Laskar |
| 2014/0120848 A1 | 5/2014 | Laskar |
| 2014/0266471 A1 | 9/2014 | Zhu et al. |
| 2014/0266889 A1 | 9/2014 | Schiller |
| 2014/0266890 A1 | 9/2014 | Schiller et al. |
| 2014/0266891 A1 | 9/2014 | Schiller et al. |
| 2014/0266892 A1 | 9/2014 | Schiller |
| 2014/0266893 A1 | 9/2014 | Rasheed et al. |
| 2014/0266894 A1 | 9/2014 | Rasheed et al. |
| 2014/0273817 A1 | 9/2014 | Schiller |

FOREIGN PATENT DOCUMENTS

| | | |
|---|---|---|
| EP | 0305099 A2 | 3/1989 |
| EP | 0504151 A1 | 9/1992 |
| EP | 0754355 A1 | 1/1997 |
| EP | 1047216 A2 | 10/2000 |
| EP | 1020055 A4 | 12/2001 |
| EP | 1261064 A1 | 11/2002 |
| EP | 1267444 A2 | 12/2002 |
| EP | 1672468 A2 | 6/2006 |
| EP | 2003799 A1 | 12/2008 |
| EP | 2456079 A2 | 5/2012 |
| WO | 8601057 A1 | 2/1986 |
| WO | 8706072 A1 | 10/1987 |
| WO | 9414178 A1 | 6/1994 |
| WO | 9721284 A1 | 6/1997 |
| WO | 9832245 A1 | 7/1998 |
| WO | 9916221 A1 | 4/1999 |
| WO | 0051202 A1 | 8/2000 |
| WO | 0055986 A1 | 9/2000 |
| WO | 0074170 A2 | 12/2000 |
| WO | 0117065 A1 | 3/2001 |
| WO | 0198839 A2 | 12/2001 |
| WO | 03023438 A2 | 3/2003 |
| WO | 03041283 A2 | 5/2003 |
| WO | 03079043 A2 | 9/2003 |
| WO | 2004021541 A1 | 3/2004 |
| WO | 03038513 A3 | 5/2004 |
| WO | 2004082197 A2 | 9/2004 |
| WO | 2006133225 A2 | 12/2006 |
| WO | 2007130442 A2 | 11/2007 |
| WO | 2010024539 A2 | 3/2010 |
| WO | 2010073241 A3 | 8/2010 |
| WO | 2011008146 A1 | 1/2011 |
| WO | 2012033509 A1 | 3/2012 |
| WO | 2014057329 A2 | 4/2014 |
| WO | 2014150615 A1 | 9/2014 |
| WO | 2014151933 A2 | 9/2014 |

OTHER PUBLICATIONS

The Esential Guide to Data Conversion, makeadifference, www.analog.com/DataConverters, Mar. 29, 2012, pp. 1-6.*
"An Analysis of Power Consumption in a Smartphone", NICTA, University of New South Wales, 2010 by Aaron Carroll, (pp. 14) https://www.usenix.org/legacy/event/usenix10/techlfull_papers/Carroll.pdf.
"Standby Consumption in Households State of the Art and Possibilities for Reduction for Home Electronics", Delft, The Netherlands (pp. 8) http://standby.lbl.gov/pdf/siderius.html.
"Wake on Wireless: An Event Driven Energy Saving Strategy for Battery Operated Devices", Massachusetts Institute of Technology Cambridge, 2002 by Eugene Shih et al. (pp. 12) http://research.microsoft.com/en-us/um/people/bahl/Papers/Pdf/mobicom02.pdf.
"Reducing Leaking Electricity to 1 Watt" National Laboratory, Berkeley, CA, Aug. 28, 1998 by Alan Meier et al. (pp. 10) http://standby.lbl.gov/pdf/42108.html.
"Monitoring in Industrial Systems Using Wireless Sensor Network With Dynamic Power Management", Dept. of Technol., Univ. Regional do Noroeste do Estado do Rio Grande do Sul (UNIJUI), Ijui, Brazil, Jul. 21, 2009 by F. Salvadori (p. 1) http://ieeexplore.ieee.org/xpl/login.jsp?tp=&arnurnber=5169976&url=http%3A%2F%2Fieeexplore.ieee.org%2Fxpls%2Fabs_all.jsp%3Farnumber%3D5169976.
"Reducing Power in High-performance Microprocessors", Intel Corporation,Santa Clara CA. 1998 by Vivek Tiwari et al. (pp. 6) http://www.cse.psu.edu/~xydong/files/proceedings/DAC2010/data/1964-2006_papers/PAPERS/1998/DAC98_732.PDf.
"Simulating the Power Consumption of Large-Scale Sensor Network Applications", Division of Engineering and Applied Sciences,Harvard University, by Victor Shnayder et al. (pp. 13) http://web.stanford.edu/class/cs344a/papers/sensys04ptossim.pdf.
"Distributed Transmit Beamforming:Challenges and Recent Progress", University of California at Santa Barbara, 2009 by Raghuraman Mudumbai et al. (pp. 9) http://spinlab.wpi.edu/pubs/Mudumbai_COMMAG_2009.pdf.
"Design and Simulation of a Low Cost Digital Beamforming (DBF) Receiver for Wireless Communication",International Journal of Innovative Technology and Exploring Engineering (IJITEE), vol. 2, Jan. 2, 2013 by V.N Okorogu (pp. 8) http://www.ijitee.org/attachments/File/v2i2/B0351012213.pdf.
"Frequency multiplication techniques for Sub-harmonic injection locking of LC oscillators and Its application to phased-array architectures", Ottawa-Carleton Institute for Electrical and Computer Engineering, 2013 by Yasser Khairat Soliman (pp. 2) https://curve.carleton.ca/system/files/theses/27532.pdf.
"Active Integrated Antennas", Transactions on microwave theory and techniques, vol. 50, No. 3, Mar. 2002, by Kai Chang et al. (pp. 8) http://www.cco.caltech.edu/~mmic/reshpubindex/MURI/MURI03/York2.pdf.

(56) References Cited

OTHER PUBLICATIONS

"Low cost and compact active integrated antenna transceiver for system applications", Dept. of Electronics Engineers, Texas A&M University, College Station, Texas, USA, Oct. 1996 by R.A. Flynt et al. (pp. 1) http://ieeexplore.ieee.org/xpl/login.jsp?tp=&arnumber=538955&url=http%3A%2F%2Fieeexplore.ieee.org%2Fxpls%2Fabs_all.jsp%3Farnumber%3D538955.

"Phased array and adaptive antenna transceivers in wireless sensor networks", Institute of Microsystem Technology—IMTEK, Albert-Ludwig-University, Freiburg, Germany, 2004 by Ruimin Huang et al. (pp. 1) http://ieeexplore.ieee.org/xpl/login.jsp?tp=&arnumber=1333329&url=http%3A%2F%2Fieeexplore.ieee.org%2Fxpls%2Fabs_all.jsp%3Farnumber%3D1333329.

"A mixed-signal sensor interface microinstrument", Sensors and Actuators A: Physical, Science Direct, vol. 91, Issue 3, Jul. 15, 2001 by Keith L. Kraver et al. (p. 2) http://www.sciencedirect.com/science/article/pii/S0924424701005969.

"On the Feasibility of Distributed Beamforming in Wireless Networks", IEEE transactions on wireless communications, vol. 6,No. 5, May 2007 by R. Mudumbai. (pp. 10) https://research.engineering.uiowa.edu/wrl/sites/research.engineering.uiowa.edu.wrl/files/attachments/TWICOM07_0.pdf.

"Antenna Systems for Radar Applications Information Technology Essay", (pp. 15) http://www.ukessays.com/essays/information-technology/antenna-systems-for-radar-applications-information-technology-essay.php.

"Smart antennas control circuits for automotive communications", Mar. 28, 2012, by David Cordeau et al. (pp. 10) https://hal.archives-ouvertes.fr/file/index/docid/683344/filename/Cordeau_Paillot.pdf.

"Adaptive Beam Steering of RLSA Antenna With RFID Technonlogy", Progress in Electromagnetics Research, vol. 108, Jul. 19, 2010 by M. F. Jamlos et al. (pp. 16) http://jpier.org/PIER/pier108/05.10071903.pdf.

"Adaptive power controllable retrodirective array system for wireless sensor server applications", IEEE Xplore, Deptartment of Electrical Engineering, University of California, Los Angeles, CA, USA Dec. 2005, by Lim et al. (p. 1) ieeexplore.ieee.org/xpl/login.jsp?tp=&arnumber=1550023&url=http%3A%2F%2Fieeexplore.ieee.org%2Fxpls%2Fabs_all.jsp%3Farnumber%3D1550023.

"Retrodirective arrays for wireless communications", Microwave Magzine, IEEE Xplore, vol. 3,Issue 1, Mar. 2002 by R.Y. Miyamoto et al. (p. 1) http://ieeexplore.ieee.org/xpl/login.jsp?tp=&arnumber=990692&url=http%3A%2F%2Fieeexplore.ieee.org%2Fxpls%2Fabs_all.jsp%3Farnumber%3D990692.

"An Active Integrated Retrodirective Transponder for Remote Information Retrieval-on-Demand", IEEE Transactions on Microwave Theory and Techniques, vol. 49, No. 9, Sep. 2001 by Ryan Y. Miyamoto et al. (pp. 5) http://www.mwlab.ee.ucla.edulpublications/2001c/mtt_trans/d.pdf.

"Ongoing retro directive Array Research at UCLA", The Institute of electrical Information and communication Engineers, by Kevin M.K.H. Leong et al. (pp. 6) http://www.ieice.org/~wpt/paper/SPS02-08.pdf.

"Digital communications using self-phased arrays", Jet Propulsion Lab., California Inst. of Technology, Pasadena, CA, USA, IEEE Xplore, vol. 49, Issue 4, Apr. 2001 by L.D. DiDomenico et al. (p. 1) http://ieeexplore.ieee.org/xpl/login.jsp?tp=&arnumber=915442&url=http%3A%2F%2Fieeexplore.ieee.org%2Fxpls%2Fabs_all.jsp%3Farnumber%3D915442.

"Large Active Retrodirective Arrays for Space Applications", NASA Technical Documents, Jan. 15, 1978 by R. C Chernoff (p. 1) https://archive.org/details/nasa_techdoc_19780013390.

"Beam Steering in Smart Antennas by Using Low Complex Adaptive Algorithms", International Journal of Research in Engineering and Technology, vol. 02 Issue: 10, Oct. 2013 by Amamadh Poluri et al. (pp. 7) http://ijret.org/Volumes/V02/I10/IJRET_110210085.pdf.

"Efficient Adaptive Beam Steering Using INLMS Algorithm for Smart Antenna", ECE Department, QIS College of Engineering and Technology, Ongole, India, Jul. 22, 2012 by E. Anji Naik et al. (pp. 5) http://www.irnetexplore.ac.in/IRNetExplore_Proceedings/Vijayawada/AEEE/AEEE_22ndJuly2012/AEEE_22ndJuly2012_doc/paper3.pdf.

"A Primer on Digital Beamforming", Mar. 26, 1998 by Toby Haynes (pp. 15) http://www.spectrumsignal.com/publications/beamform_primer.pdf.

"Design of Beam Steering Antenna Array for Rfid Reader Using Fully Controlled RF Switches", Mobile and Satellite Communications Research Centre University of Bradford by D. Zhou et al. (pp. 7).

"Electronically steerable passive array radiator antennas for low-cost analog adaptive beamforming", ATR Adaptive Commun. Res. Labs., Kyoto, Japan, IEEE Xplore, 2000 by T. Ohira et al. (p. 1) http://ieeexplore.ieee.org/xpl/articleDetails.jsp?tp=&arnumber=858918&url=http%3A%2F%2Fieeexplore.ieee.org%2Fxpls%2Fabs_all.jsp%3Farnumber%3D858918.

"Sector-mode beamforming of a 2.4-GHz electronically steerable passive array radiator antenna for a wireless ad hoc network", ATR Adaptive Commun. Res. Labs., Kyoto, Japan, IEEE Xplore, 2002 by Jun Cheng et al. (p. 1) http://ieeexplore.ieee.org/xpl/articleDetails.jsp?arnumvber=1016265.

"Design of electronically steerable passive array radiator (ESPAR) antennas", ATR Adaptive Commun. Res. Lab., Kyoto, Japan, IEEE Xplore, 2000 by K. Gyoda et al. (p. 1) http://ieeexplore.ieee.org/xpl/articleDetails.jsp?arnumber=875370.

"An adaptive MAC protocol for wireless ad hoc community network (WACNet) using electronically steerable passive array radiator antenna", ATR Adaptive Commun. Res. Lab., Kyoto, Japan, IEEE Xplore, 2001 by S. Bandyopadhyay et al. (p. 1) http://ieeexplore.ieee.org/xpl/login.jsp?tp=&arnumber=965958&url=http%3A%2F%2Fieeexplore.ieee.org%2Fxpls%2Fabs_all.jsp%3Farnumber%3D965958.

"A low complex adaptive algorithm for antenna beam steering", Dept. of Electron & Communication Engineering, Narasaraopeta Eng. Collage, Narasaraopeta, India , IEEE Xplore, 2011 by M.Z.U. Rahman et al. (p. 1) http://ieeexplore.ieee.org/xpl/login.jsp?tp=&arnumber=6024567&url=http%3A%2F%2Fieeexplore.ieee.org%2Fxpls%2Fabs_all.jsp%3Farnumber%3D6024567.

"Receiver Front-End Architectures—Analysis and Evaluation", Mar. 1, 2010 by Pedro Cruz et al. (p. 27) http://cdn.intechopen.com/pdfs-wm/9961.pdf.

"Analysis and design of injection-locked LC dividers for quadrature generation", Dipt. di Ingegneria dell"Informazione, University di Modena e Reggio Emilia, Italy, Solid-State Circuits, IEEE Xplore, vol. 39, Issue 9, Sep. 2004 by A. Mazzanti, et al. (p. 1) http://ieeexplore.ieee.org/xpl/login.jsp?tp=arnumber=1327739&url=http%3A%2F%2Fieeexplore.ieee.org%2Fxpls%2Fabs_all.jsp%3Farnumber%3D1327739.

"An injection-locking scheme for precision quadrature generation", CeLight Inc., Iselin, NJ, USA, Solid-State Circuits, IEEE Xplore, vol. 37, Issue 7, Jul. 2002 by P. Kinget et al. (p. 1) http://ieeexplore.ieee.org/xpl/login.jsp?tp=&arnumber=1015681&url=http%3A%2F%2Fieeexplore.ieee.org%2Fxpls%2Fabs_all.jsp%3Farnumber%3D1015681.

"The Fundamentals of Signal Generation", Agilent Technologies, Electronic Design, Jan. 24, 2013 by Erik Diez (pp. 12) http://electronicdesign.com/test-amp-measurement/fundamentals-signal-generation.

"Microwave CMOS Beamforming Transmitters", Lund Institute of Technology, Nov. 2008 by Johan Wernehag (pp. 234) http://lup.lub.lu.se/luur/download?func=downloadFile&recordOld=1265511&fileOld=1265527.

"A new beam-scanning technique by controlling the coupling angle in a coupled oscillator array", Dept. of Electr. Eng., Korea Adv. Inst. of Sci. & Technol., Seoul, South Korea, IEEE Xplore, vol. 8, Issue 5, May 1998 by Jae-Ho Hwang et al. (p. 1) http://ieeexplore.ieee.org/xpl/login.jsp?tp=&arnumber=668707&url=http%3A%2F%2Fieeexplore.ieee.org%2Fxpls%2Fabs_all.jsp%3Farnumber%3D668707.

\* cited by examiner

SIMULTANEOUS ACCOMMODATION OF A LOW POWER SIGNAL AND AN INTERFERING SIGNAL IN A RADIO FREQUENCY (RF) RECEIVER

FIELD OF TECHNOLOGY

This disclosure relates generally to wireless receivers and, more particularly, to simultaneous accommodation of a low power signal and an interfering signal in a Radio Frequency (RF) receiver.

BACKGROUND

A Radio Frequency (RF) receiver (e.g., a Global Positioning System (GPS) receiver) may receive an input signal including a desired signal component and an interfering signal component. The interfering signal component may have a higher power level compared to the desired signal component. The RF receiver may not be capable of processing the interfering signal component simultaneously with the low level desired signal component due to limited bandwidth and/or dynamic range thereof. Moreover, an Analog-to-Digital Converter (ADC) circuit of the RF receiver may not convert the low power desired signal component properly due to a resolution limitation thereof.

SUMMARY

A method, a circuit and/or a system of simultaneous accommodation of a low power signal and an interfering signal in a Radio Frequency (RF) receiver are disclosed.

In one aspect, a method includes providing a highly linear front end in a Radio Frequency (RF) receiver, implementing a high Effective Number of Bits (ENOB) Analog to Digital Converter (ADC) circuit in the RF receiver, and sampling, through the high ENOB ADC circuit, at a frequency having harmonics that do not coincide with a desired signal component of an input signal of the RF receiver to eliminate spurs within a data bandwidth of the RF receiver. The input signal includes the desired signal component and an interference signal component. The interference signal component has a higher power level than the desired signal component. The method also includes simultaneously accommodating the desired signal component and the interference signal component in the RF receiver based on an increased dynamic range of the RF receiver and the high ENOB ADC circuit provided through the highly linear front end and the high ENOB ADC circuit.

In another aspect, a method includes providing an RF receiver having dynamic range enough to simultaneously accommodate a desired signal component of an input signal and an interference signal component thereof. The interference signal component has a power level higher than that of the desired signal component. The RF receiver has a double superheterodyne configuration that includes an RF mixer and an image reject mixer. The method also includes selecting an image frequency of the image reject mixer to coincide with a frequency of the interference signal component to enable cancellation thereof through the image reject mixer while having a capability to receive the desired signal component.

In yet another aspect, a method includes implementing a high ENOB ADC circuit in an RF receiver having a double superheterodyne configuration including an RF mixer and an image reject mixer, and utilizing an output of a VCO to generate a local oscillator reference signal to the image reject mixer. The method also includes providing a clock signal to the high ENOB ADC circuit divided down in frequency from the output of the VCO providing the local oscillator reference signal to the image reject mixer to reduce a jitter thereof.

Further, in another aspect, an integrated circuit (IC) chip includes a high band channel receiver configured to receive a Global Positioning System (GPS) carrier signal $L_1$ carrying a standard positioning code along with navigational data, and a low band channel receiver configured to receive a GPS carrier signal $L_2$ carrying a precision positioning code. Each of the high band channel receiver and the low band channel receiver is capable of receiving $L_1$ and $L_2$ respectively with precision and mitigating ionospheric effects from $L_1$ and $L_2$ respectively. $L_1$ has a higher frequency than $L_2$.

The each of the high band channel receiver and the low band channel receiver includes a highly linear front end, and a high ENOB ADC circuit. A sampling frequency of the high ENOB ADC circuit has harmonics that do not coincide with a desired signal component of each of $L_1$ and $L_2$ to eliminate spurs within a data bandwidth of the each of the high band channel receiver and the low band channel receiver. The each of $L_1$ and $L_2$ additionally includes an interference signal component having a power level higher than that of the desired signal component.

The each of the high band channel receiver and the low band channel receiver is configured to simultaneously accommodate the desired signal component and the interference signal component of the each of $L_1$ and $L_2$ based on an increased dynamic range of the each of the high band channel receiver and the low band channel receiver and the high ENOB ADC circuit provided through the highly linear front end and the high ENOB ADC circuit.

Further, in yet another aspect, an in-band cancellation system includes an RF receiver, and a channel emulator to emulate a channel between a transmitter of an input signal and the RF receiver. The input signal includes an undesired in-band signal component and a desired signal component, and the channel emulator has a sampled version of the undesired in-band signal component fed as an input thereto. The in-band cancellation system also includes an adaptive filter having parameters capable of being varied based on the input signal being fed as a reference input thereto to vary a frequency of a correlated reference signal filtered therethrough. The correlated reference signal is generated based on a correlation between the input signal and the undesired in-band signal component. The filtered signal from the adaptive filter is configured to be subtracted from an output of the channel emulator to remove the in-band signal component from the input signal.

Still further, in yet another aspect, a method includes mixing an input signal including a desired signal component and an interference signal component close in frequency to the desired signal component down to an Intermediate Frequency (IF) through an RF receiver to reduce an interference bandwidth to account for during image rejection. The method also includes folding the interference signal component and the desired signal component during the image rejection through an image reject mixer of the RF receiver such that the interference signal component is out-of-band with respect to the desired signal component.

Furthermore, in yet another aspect, a wireless system includes a wireless transmitter, and a wireless RF receiver configured to receive an input signal from the wireless transmitter. The input signal includes a desired signal component and an interference signal component. The interference signal component has a power level higher than that of the desired signal component. The wireless RF receiver includes a highly linear front end; and a high ENOB ADC circuit. A sampling frequency of the high ENOB ADC circuit has harmonics that do not coincide with the desired signal component to eliminate spurs within a data bandwidth of the wireless RF receiver.

The wireless RF receiver is configured to simultaneously accommodate the desired signal component and the interference signal component based on an increased dynamic range of the wireless RF receiver and the high ENOB ADC circuit provided through the highly linear front end and the high ENOB ADC circuit.

The methods and systems disclosed herein may be implemented in any means for achieving various aspects, and may be executed in a form of a machine-readable medium embodying a set of instructions that, when executed by a machine, cause the machine to perform any of the operations disclosed herein.

Other features will be apparent from the accompanying drawings and from the detailed description that follows.

DESCRIPTION OF THE DIAGRAMS

Example embodiments are illustrated by way of example and not limitation in the figures of the accompanying drawings, in which like references indicate similar elements and in which.

Other features of the present embodiments will be apparent from the accompanying drawings and from the disclosure of the various embodiments.

DETAILED DESCRIPTION

A method, a circuit and/or a system of simultaneous accommodation of a low power signal and an interfering signal in a Radio Frequency (RF) receiver are disclosed. In the following description, for the purposes of explanation, numerous specific details are set forth in order to provide a thorough understanding of the various embodiments. It will be evident, however to one skilled in the art that the various embodiments may be practiced without these specific details.

Figure 1:
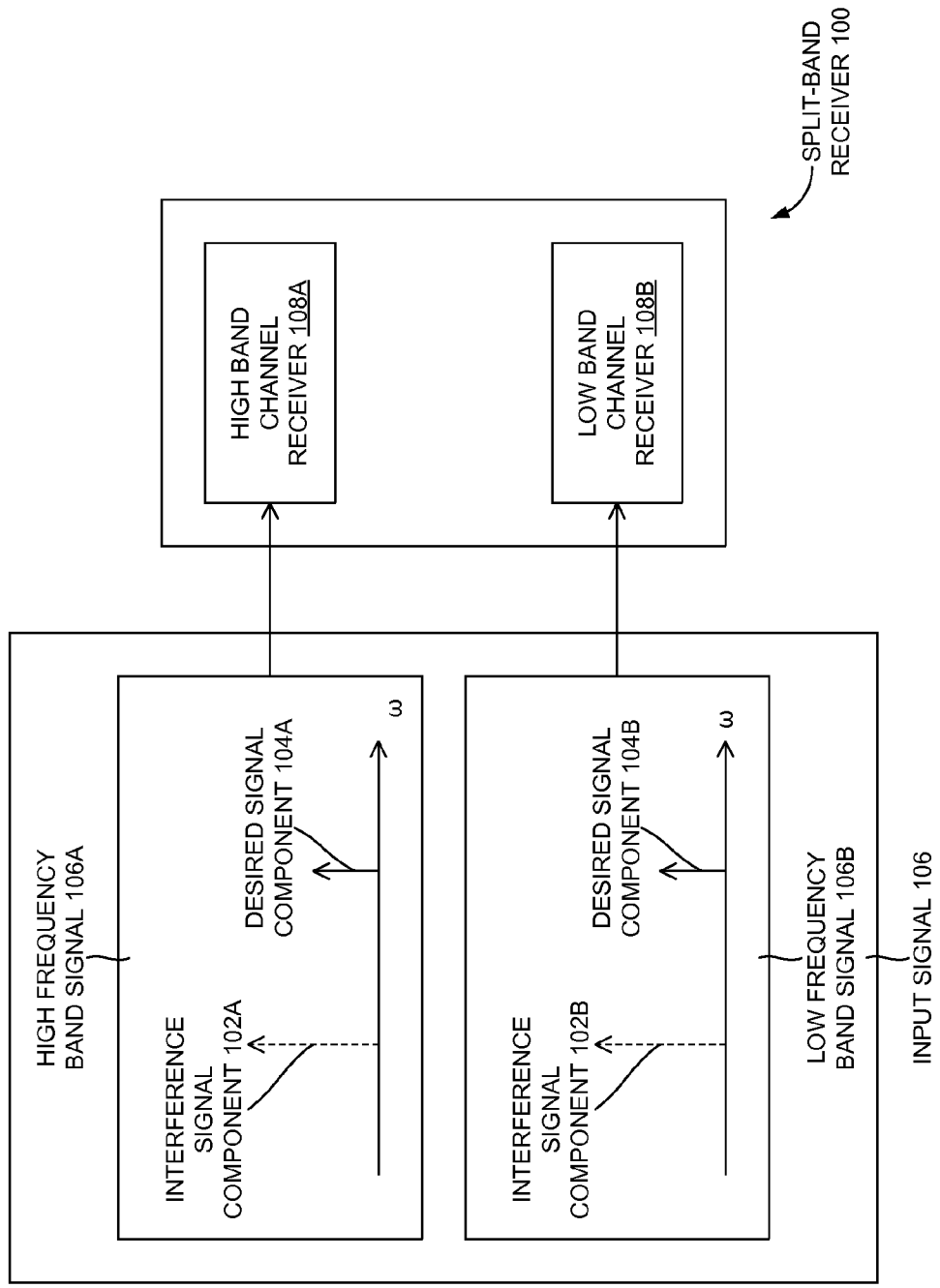
FIG. 1 is a schematic view of a wireless split-band receiver, according to one or more embodiments.

FIG. 1 shows a wireless split-band receiver 100, according to one or more embodiments. In one or more embodiments, split-band receiver 100 may include two receivers, viz., a high band channel receiver 108A and a low band channel receiver 108B in order to process high frequency band signals and low frequency band signals separately. An example application may be in Global Positioning System (GPS) signal reception of two carrier signals $L_1$ and $L_2$. Here, frequency $L_1$ may carry a standard positioning code along with the navigational data, and frequency $L_2$ may carry a precision positioning code. For the aforementioned purpose, in one example embodiment, a high frequency band signal 106A (e.g., 1.5-1.65 GHz) may be received through high band channel receiver 108A and a low frequency band signal 106B (e.g., 1.1-1.3 GHz) may be received through low band channel receiver 108B. While FIG. 1 shows two receivers for illustrative purposes, one or more concepts associated with the exemplary embodiments discussed herein may be related to a single receiver configured to receive a single frequency band. Therefore, exemplary embodiments should not be construed as being limited to a two receiver setup.

In one or more embodiments, each of high frequency band signal 106A and low frequency band signal 106B may have a desired signal component 104, along with an interference signal component 102. In one or more embodiments, interference signal component 102 may be an unwanted signal having a high power level, and desired signal component 104 may be a wanted signal having a power level lower than that of interference signal component 102. In an example scenario, interference signal component 102 may be at least 60 dB higher than desired signal component 104.

In one example embodiment, split-band receiver 100 may accommodate input signal 106 (A,B) carrying desired signal component 104 and interference signal component 102 simultaneously with minimized distortion to convert an analog input signal 106 (A,B) into digital data. In the scenario of interference signal component 102 being at least 60 dB higher than desired signal component 104, split-band receiver 100 (or, individual receivers thereof) may have at least 60 dB of dynamic range to accommodate both interference signal component 102 and desired signal component 104.

Figure 2:
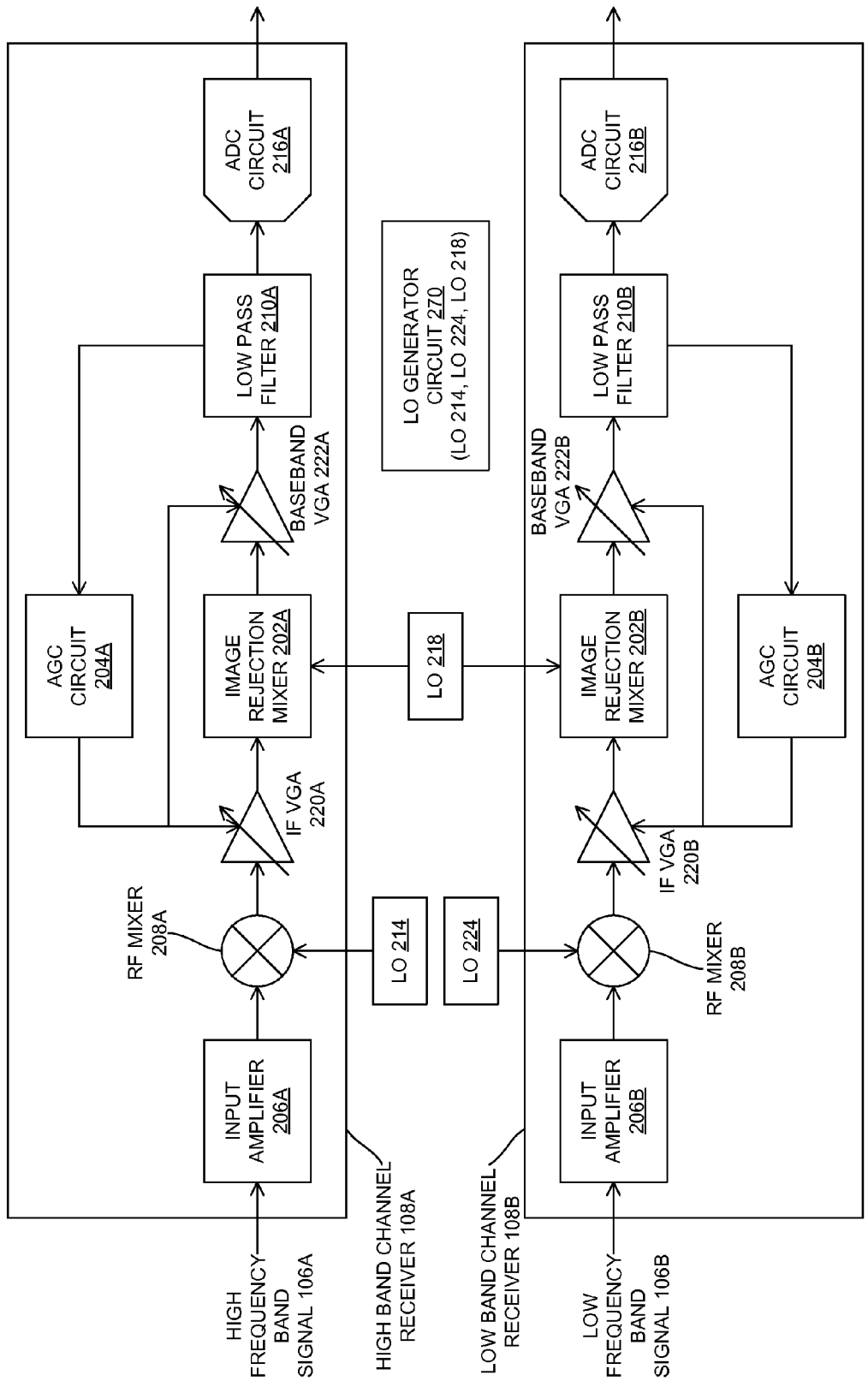
FIG. 2 is a detailed schematic view of the split-band receiver of FIG. 1.

FIG. 2 shows split-band receiver 100 of FIG. 1 having a double superheterodyne architecture in detail. In one or more embodiments, each of high band channel receiver 108A and low band channel receiver 108B may include an input amplifier 206 (A,B) (e.g., an isolation amplifier) to amplify the corresponding high frequency band signal 106A/low frequency band signal 106B before being mixed (e.g., through RF mixer 208 (A,B)) with a signal from a local oscillator (LO) (214, 224) (e.g., a Temperature Compensated Crystal Oscillator (TCXO)) into an Intermediate Frequency (IF) component (not shown). In one or more embodiments, the IF component may serve as one of the two inputs of an image reject mixer 202 (A,B), or, an IF mixer, with the other input being the signal from another LO 218. In the two receiver embodiment of FIG. 2, LO 218 may be a common input to both image reject mixer 202A and image reject mixer 202B. It is obvious that frequencies associated with each of LO 214, LO 224 and LO 218 may be generated through the same LO generator circuit. FIG. 2 shows LO generator circuit 270 as generating the frequencies associated with the aforementioned LO 214, LO 224 and LO 218.

In one or more embodiments, image reject mixer 202 (A,B) may serve to reject interference signal component 102, thereby eliminating image noise from the unwanted sideband (or, interference signal component 102) that can pollute the noise figure of split-band receiver 100. In one or more embodiments, each of high band channel receiver 108A and low band channel receiver 108B may include an IF Variable Gain Amplifier (IF VGA 220 (A,B)) at the input (IF component side) of image reject mixer 202 (A,B) to amplify the IF component to a desired level. In one or more embodiments, the output of image reject mixer 202 (A,B) may also be amplified to an optimum level through a baseband VGA 222 (A,B). In one or more embodiments, an anti-alias Low Pass Filter (LPF) 210 (A,B) coupled to the output of image reject mixer 202 (A,B) (or, output of baseband VGA 222 (A,B)) may restrict the bandwidth of the output signal to approximately satisfy the Nyquist-Shannon sampling theorem during conversion thereof from a continuous time space into a discrete time space through an Analog-to-Digital Converter (ADC) circuit 216 (A,B).

In one or more embodiments, an AGC circuit 204 (A,B) may be located in a feedback path of the image rejection to adjust the gain of IF VGA 220 (A,B) and/or baseband VGA 222 (A,B) to an appropriate level. In other words, the output of LPF 210 (A,B) may be coupled to an input of AGC circuit 204 (A,B), whose output is then applied to IF VGA 220 (A,B). FIG. 2 shows IF VGA 220 (A,B) and baseband VGA 222 (A,B) being controlled to the same gain level.

In one or more embodiments, LO generator circuit 270 may provide clock signal(s) to RF mixer 208 (A,B), image reject mixer 202 (A,B) and/or ADC circuit 216 (A,B). In one or more embodiments, the clock signal to ADC circuit 216 (A,B) may be divided down in frequency from a higher frequency output of a Voltage Controlled Oscillator (VCO) utilized in LO generator circuit 270. Thus, in one or more embodiments, ADC clock 302 may have a lower jitter compared to the clock signal(s) to image reject mixer 202 (A,B) and/or RF mixer 208 (A,B).

Figure 3:
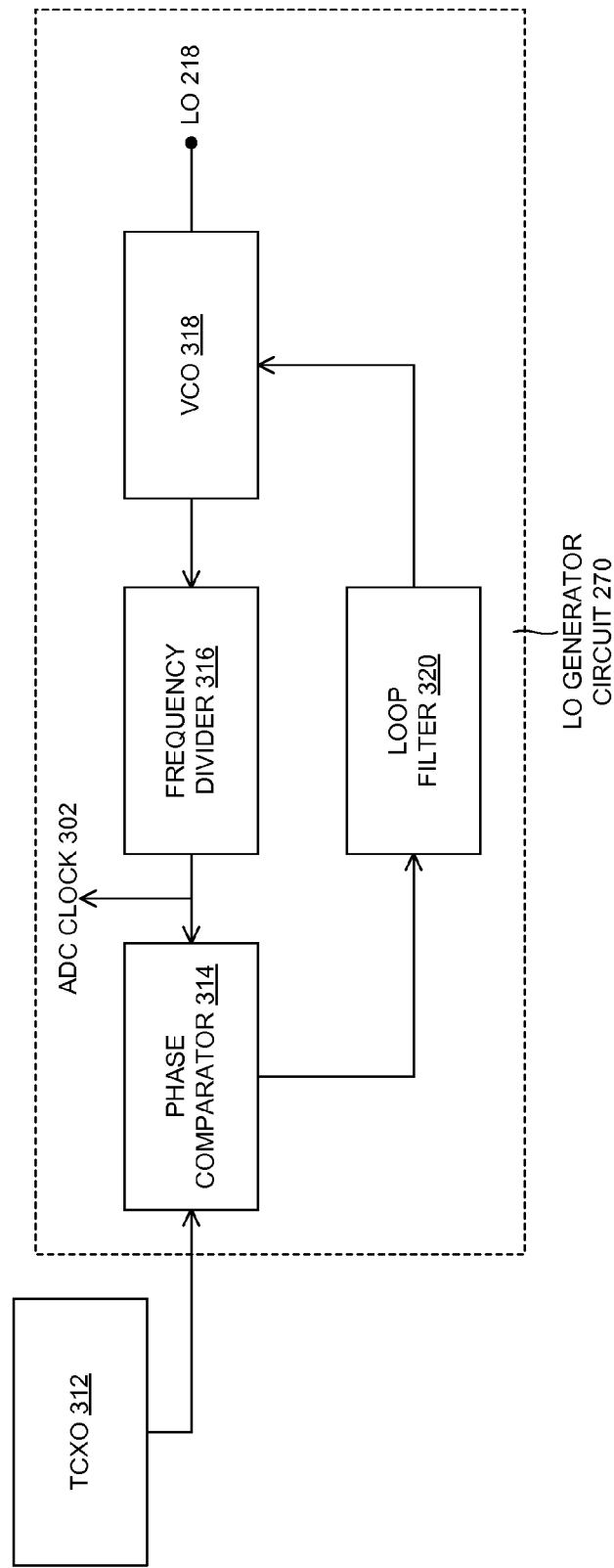
FIG. 3 is a schematic view of clock signals to be supplied to the image reject mixer and the Analog to Digital Converter (ADC) circuit of FIG. 2 being generated through a Local Oscillator (LO) generator circuit, according to one or more embodiments.

FIG. 3 shows clock signals to be supplied to image reject mixer 202 (A,B) and ADC circuit 216 (A,B) being generated through LO generator circuit 270, as discussed above. In the example embodiment of FIG. 3, LO generator circuit 270 may include phase comparator 314 to compare the phase difference between a reference signal from a TCXO 312 and a frequency divider 316 coupled between a VCO 318 and phase comparator 314. The phase difference signal from phase comparator 314 may be passed through a loop filter 320 to remove unwanted components therein and applied to a control terminal of VCO 318. The functioning of a LO generation circuit is well-known to one of ordinary skill in the art and, therefore, detailed discussion associated therewith has been skipped for the sake of convenience and brevity.

VCO 318 may have lower phase noise at desired frequencies compared to the reference TCXO 312, especially at higher frequency offsets, and, therefore, a frequency divided output of VCO 318 (or, ADC clock 302) may have lower jitter compared to an output of VCO 318. Thus, in one or more embodiments, VCO 318 may be utilized in conjunction with the high resolution ADC circuit 216 (A,B) to supply LO 218 to image reject mixer 202 (A,B). Also, in one or more embodiments, the higher frequency of VCO 318 may also be divided down in frequency (e.g., through frequency divider 316) to serve as ADC clock 302 (or, ADC clock signal). Now, because the high resolution ADC circuit 216 (A,B) is utilized in conjunction therewith, the clock jitter requirement is more stringent, thereby providing for ADC clock 302 with very low jitter.

Figure 4:
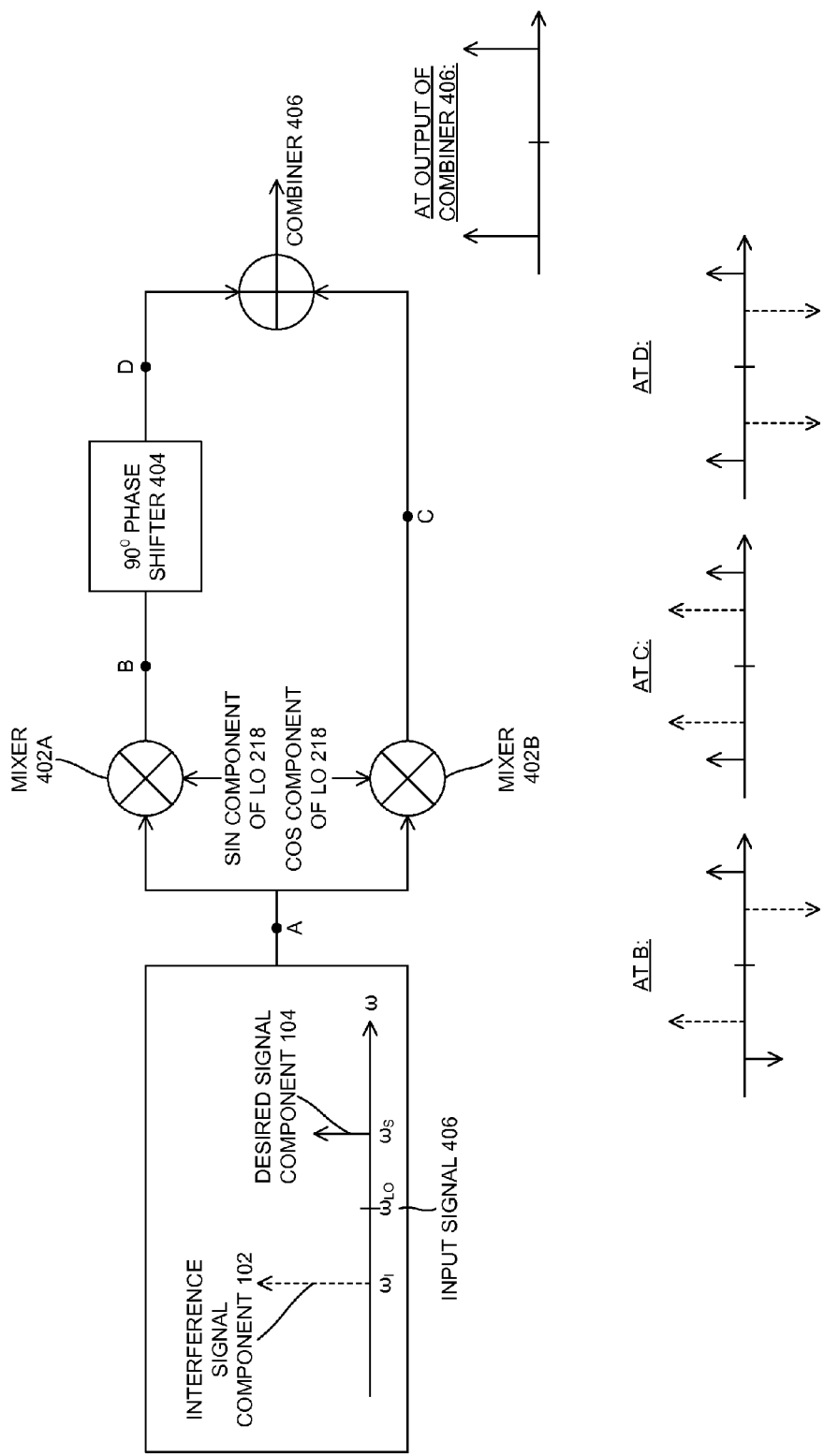
FIG. 4 is an example Hartley architecture of the image reject mixer of the split-band receiver of FIGS. 1-2.

FIG. 4 shows an example Hartley architecture 400 of image reject mixer 202 (A,B), according to one or more embodiments. It is obvious that other architectures (e.g., Weaver architecture) of image reject mixer 202 (A,B) employing concepts discussed herein are within the scope of the exemplary embodiments. FIG. 4 shows input signal 406 (e.g., high frequency band signal 406A, low frequency band signal 406B) to image reject mixer 202 (A,B) as including desired signal component 104 at frequency $\omega_S$ and interference signal component 102 at frequency $\omega_I$ relative to the frequency of LO (214, 224) ($\omega_{LO}$). It is well known that for a given $\omega_{LO}$, there are two RF frequencies that can result in the same IF frequency $\omega_{IF}$, viz., $\omega_{LO}+\omega_{IF}$ and $\omega_{LO}-\omega_{IF}$. By placing interference signal component 102 at the image location (e.g., at image frequency $\omega_{IM}=\omega_I=\omega_{LO}-\omega_{IF}$) of image reject mixer 202 (A,B), split-band receiver 100 may be configured to reject interference signal component 102.

The frequencies input to image reject mixer 202 (A,B) may be split into two branches at node A, and mixed (e.g., through mixer 402 (A,B)) with quadrature phases of LO 218 to obtain sinusoidal components at nodes B and C. Thus, neglecting the high frequency components that can be filtered, the signal at each of nodes B and C may include desired signal component 104 along with interference signal component 102. The signal at node B may further be phase shifted by 90 degrees through a 90 degree phase shifter 404 (e.g., based on a passive RC polyphase network), and the output of the phase shifting (e.g., signal at node D) may be combined with the signal at node C at combiner 406. The output of combiner 406 may have interference signal component 102 canceled out, and desired signal component 104 added in phase.

In one or more embodiments, split-band receiver 100 (or, high band channel receiver 108A, low band channel receiver 108B) may especially be useful in the case of interference signal component 102 being close in frequency to desired signal component 104. Here, in one or more embodiments, the interference bandwidth may be small when interference signal component 102 is mixed down to the IF along with desired signal component 104, thereby enabling for a smaller bandwidth to account for during image rejection through image reject mixer 202 (A,B). In one or more embodiments, image reject mixer 202 (A,B) may fold interference signal component 102 and desired signal component 104 such interference signal component 102 is out-of-band with respect to desired signal component 104.

The concepts discussed above may be utilized to implement active wireless signal cancellation to protect Global Positioning System (GPS) receivers. As discussed above, in one or more embodiments, the dynamic range of split-band receiver 100 may accommodate both desired signal component 104 and interference signal component 102 at the same time. In one or more embodiments, the high dynamic range split-band receiver 100 and ADC circuit 216 (A,B) may allow for low level desired signals and high level interfering signals to be processed at the same time. In FIG. 2, all analog circuitry to the left of ADC circuit 216 (A,B) are highly linear and may accommodate high levels of interference without distortion. By utilizing the highly linear front end and a high Effective Number of Bits (ENOB) ADC circuit 216 (A,B), the dynamic range of split-band receiver 100, in an example embodiment, may be 60 dB.

Even if image reject mixer 202 (A,B) does not provide for complete cancellation of interference signal component 102, the output level of interference signal component 102 may be reduced by 40 dB in an example embodiment by placing the potential interferer (or, interference signal component 102) at the image frequency location of image reject mixer 202 (A,B).

Exemplary embodiments also serve as a basis for in-band wireless cancellation consisting of sampling an interference source as an input and filtering the sampled signal to emulate and subsequently remove the incurred interference on the received victim signal. Here, the sampled noise signal may be acquired from a noise sampler that taps into the interference source. The cancellation involves feeding the sampled interference source through an emulated coupling channel. The chip architecture therefor may include an active bandpass filter, a Vector Modulator (VM) and a controller. The active bandpass filter may sample the interfering signal that falls within a GPS receiver band. The VM may provide phase shift and attenuation to tune out the sampled interference at an injection point.

Figure 5:
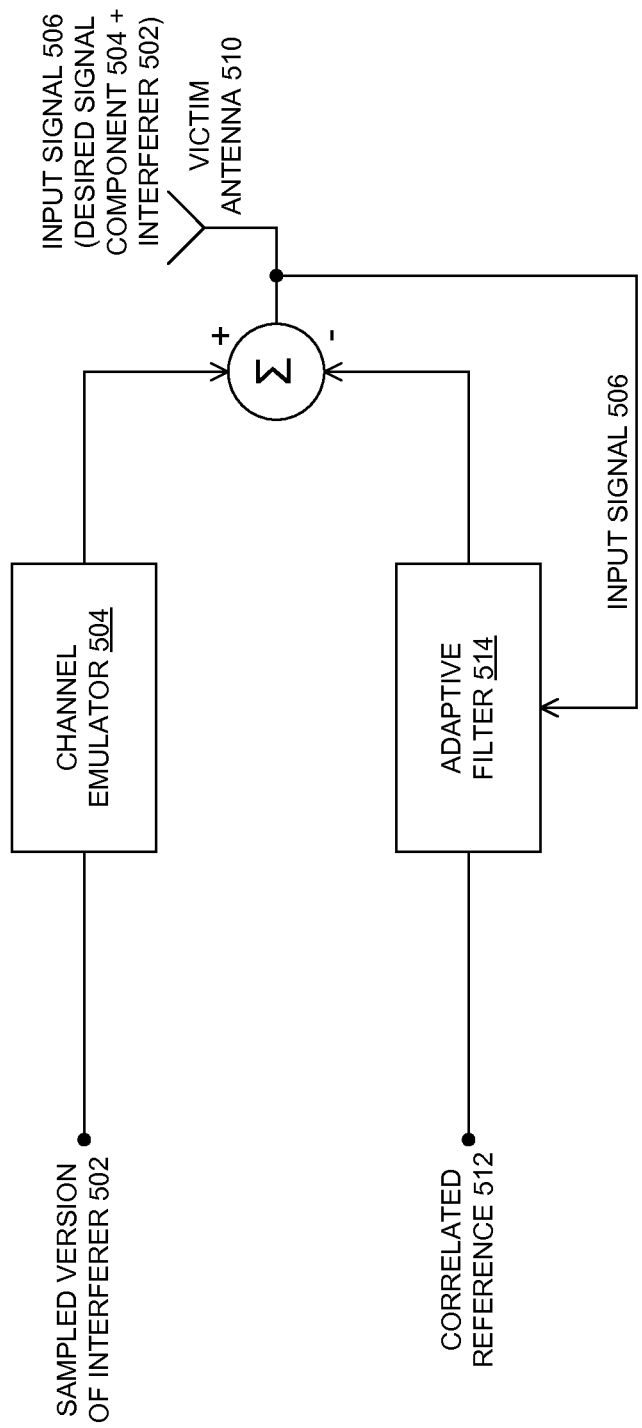
FIG. 5 is a schematic view of an example in-band cancellation system, according to one or more embodiments.

FIG. 5 shows an example in-band cancellation. Here, an in-band interferer 502 (an example interfering signal, say, interference signal component 102) may be sampled (e.g., through a noise sampler (not shown)) and fed into a channel emulator 504. Channel emulator 504 may be configured to emulate a "real-world" channel between a transmitter of an input signal 506 including in-band interferer 502 and a desired signal component 504 (analogous to desired signal component 104) and split-band receiver 100 (e.g., low band channel receiver 108B). The received input signal 506 (e.g., received through victim antenna 510) may be correlated to interferer 502 and the correlated reference (e.g., correlated reference 512) may be fed into an adaptive filter 514. Here, adaptive filter 514 may have parameters capable of being varied based on input signal 506 being fed as a reference input to adaptive filter 514 to vary the frequency of the signal being filtered through adaptive filter 514. The filtered signal may then be subtracted from the output of channel emulator 504 to remove undesired in-band component(s) (e.g., in-band interferer 502) from input signal 506, as shown in FIG. 5.

In one or more embodiments, ADC circuit 216 (A,B) may have a high resolution (e.g., 12 bit) to ensure that low level desired signals and high level unwanted interference signals are processed at the same time. In one or more embodiments, interference signal component 102 may be suppressed by utilizing knowledge of occurrence thereof. In other words, through knowing exactly where interference is going to occur, interference signal component 102 may be aligned with the image frequency location of image reject mixer 202 (A,B).

It is obvious that filters may be utilized to filter unwanted components of the mixing processes and other processes disclosed herein. Omission of one or more filters at appropriate positions in FIG. 2 should then not be construed as limiting.

In one or more embodiments, split-band receiver 100 discussed with regard to FIG. 1 may be part of a single integrated circuit (IC) chip, and may have the capability to receive dual-band GPS carrier signals $L_1$ and $L_2$ with precision. In one example embodiment, ionospheric effects may be mitigated with 1.2 GHz (example low frequency band signal 106B) and 1.5 GHz (example high frequency band signal 106A) RF GPS signal inputs.

Figure 6:
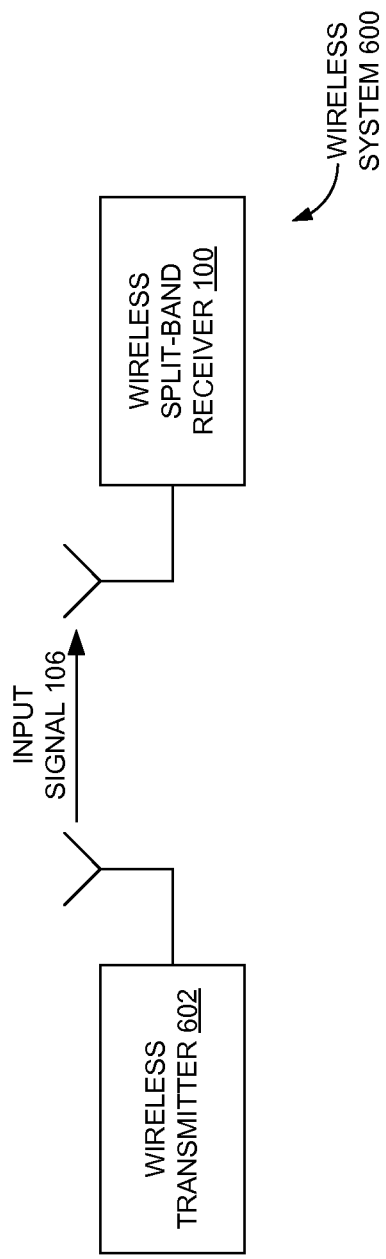
FIG. 6 is a schematic view of a wireless system including the split-band receiver of FIGS. 1-2.

FIG. 6 shows a wireless system 600, according to one or more embodiments. In one or more embodiments, wireless system 600 may include a wireless transmitter 602 and wireless split-band receiver 100 configured to receive input signal 106 (e.g., including desired signal component 104, interference signal component 102) from wireless transmitter 602. In one example embodiment, wireless split-band receiver 100 may be a GPS receiver. In another example embodiment, wireless system 600 may be a cellular transceiver or a Wi-Fi™ transceiver. Other examples of wireless split-band receiver 100 and/or wireless system 600 are within the scope of the exemplary embodiments.

In one or more embodiments, the high dynamic range of split-band receiver 100 may be achieved by implementing ADC circuit 216 (A,B) in a high gain/low-noise system (e.g., split-band receiver 100) with other circuitry. In one or more example embodiments, ADC circuit 216 (A,B) may be sampling at a frequency having harmonics thereof that do not interfere with high frequency band signal 106A (or, channel) and low frequency band signal 106B (or, channel). Thus, by design, spurs may be absent within a data bandwidth of split-band receiver 100 (or, high band channel receiver 108A, low band channel receiver 108B). As discussed above, ADC circuit 216 (A,B) may have high resolution enough to accommodate desired signals and interference signals simultaneously. In order for ADC circuit 216 (A,B) to function properly, electronics in split-band receiver 100 (or, high band channel receiver 108A, low band channel receiver 108B) may need to be linear.

In one example embodiment, as discussed above, through the utilization of a highly linear front end of split-band receiver 100 (or, high band channel receiver 108A, low band channel receiver 108B) and a high ENOB ADC circuit 216 (A,B), the entire receiver chain of split-band receiver 100 may have over 60 dB of dynamic range. In embodiments related to reduced power applications not requiring high dynamic range, a 3 bit ADC may be used instead of the 12 bit ADC example mentioned above.

Figure 7:
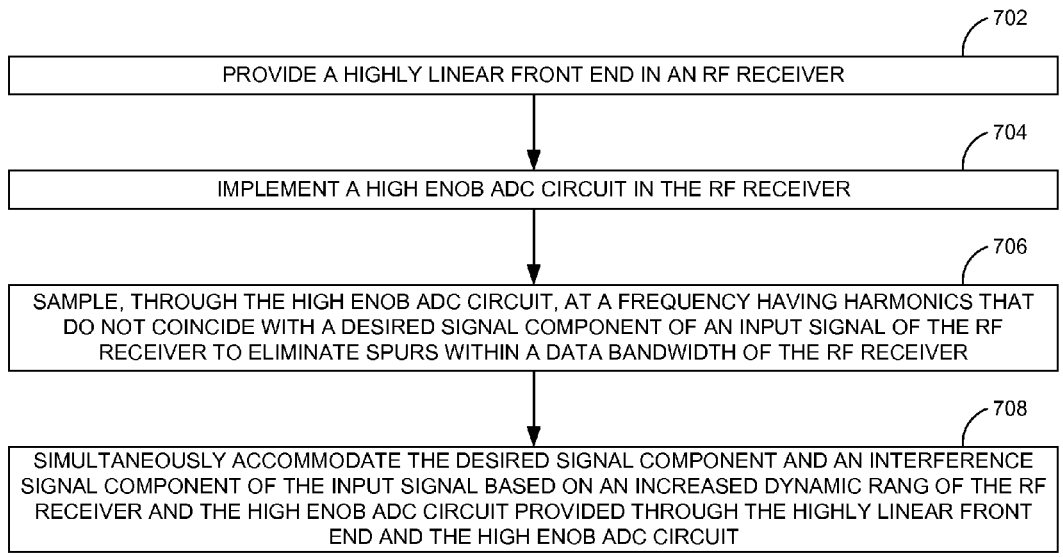
FIG. 7 is a process flow diagram detailing the operations involved in a method of realizing a Radio Frequency (RF) receiver having a dynamic range large enough to accommodate an interference signal component and a desired signal component of an input signal, according to one or more embodiments.

FIG. 7 shows a process flow diagram detailing the operations involved in a method of realizing an RF receiver (e.g., high band channel receiver 108A, low band channel receiver 108B) having a dynamic range large enough to accommodate interference signal component 102 and desired signal component 104 of input signal 106, according to one or more embodiments. In one or more embodiments, operation 702 may involve providing a highly linear front end in the RF receiver. In one or more embodiments, operation 704 may involve implementing a high ENOB ADC circuit (e.g., ADC circuit 216 (A,B)) in the RF receiver. In one or more embodiments, operation 706 may involve sampling, through the high ENOB ADC circuit, at a frequency having harmonics that do not coincide with desired signal component 104 to eliminate spurs within a data bandwidth of the RF receiver.

In one or more embodiments, input signal 106 may include desired signal component 104 and interference signal component 102. In one or more embodiments, interference signal component 102 may have a higher power level than desired signal component 104. In one or more embodiments, operation 708 may then include simultaneously accommodating desired signal component 104 and interference signal component 102 in the RF receiver based on an increased dynamic range of the RF receiver and the high ENOB ADC circuit provided through the highly linear front end and the high ENOB ADC circuit.

Figure 8:
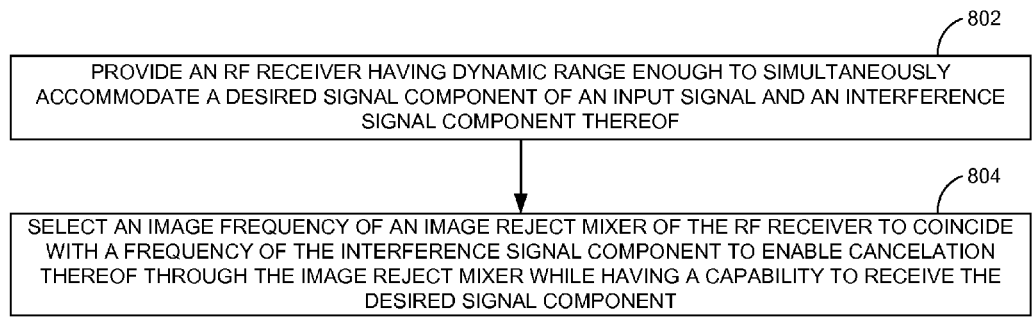
FIG. 8 is a process flow diagram detailing the operations involve in canceling an interference signal component from an input signal through an RF receiver, according to one or more embodiments.

FIG. 8 shows a process flow diagram detailing the operations involve in a method of canceling interference signal component 102 from input signal 106 through an RF receiver (e.g., high band channel receiver 108A, low band channel receiver 108B), according to one or more embodiments. In one or more embodiments, operation 802 may include providing an RF receiver having dynamic range enough to simultaneously accommodate desired signal component 104 of input signal 106 and interference signal component 102 thereof. In one or more embodiments, interference signal component 102 may have a power level higher than that of desired signal component 104. In one or more embodiments, the RF receiver has a double superheterodyne configuration that includes RF mixer 208 (A,B) and image reject mixer 202 (A,B). T In one or more embodiments, operation 804 may then include selecting an image frequency of image reject mixer 202 (A,B) to coincide with a frequency of interference signal component 102 to enable cancellation thereof through image reject mixer 202 (A,B) while having a capability to receive desired signal component 104.

Figure 9:
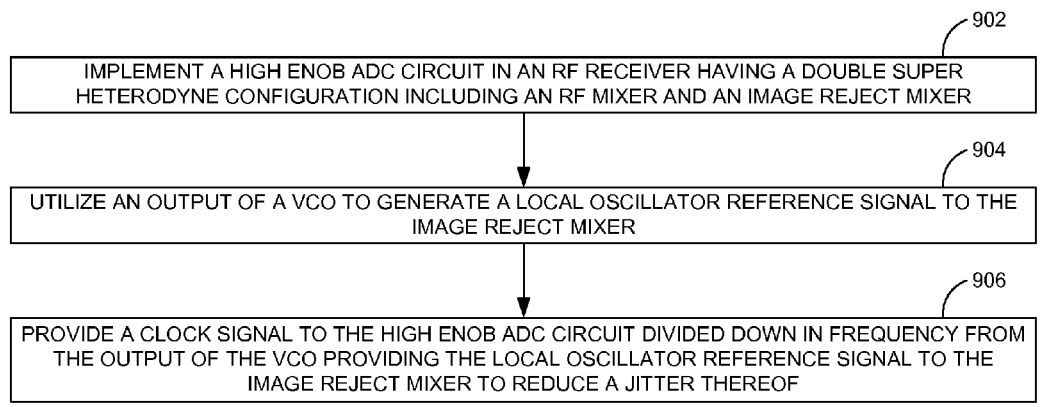
FIG. 9 is a process flow diagram detailing the operations involved in reducing jitter in a clock signal to the ADC circuit of FIG. 2, according to one or more embodiments.

FIG. 9 shows a process flow diagram detailing the operations involved in a method of reducing jitter in a clock signal to ADC circuit 216 (A,B), according to one or more embodiments. In one or more embodiments, operation 902 may include implementing a high ENOB ADC circuit (e.g., ADC circuit 216 (A,B)) in an RF receiver (e.g., high band channel receiver 108A, low band channel receiver 108B) having a double superheterodyne configuration including RF mixer 208 (A,B) and image reject mixer 202 (A,B). In one or more embodiments, operation 904 may involve utilizing an output of a Voltage Controlled Oscillator (VCO) 318 to generate a local oscillator reference signal to image reject mixer 202 (A,B).

In one or more embodiments, operation 906 may then include providing a clock signal to the high ENOB ADC circuit divided down in frequency from the output of VCO 318 providing the local oscillator reference signal to image reject mixer 202 (A,B) to reduce a jitter thereof.

Figure 10:
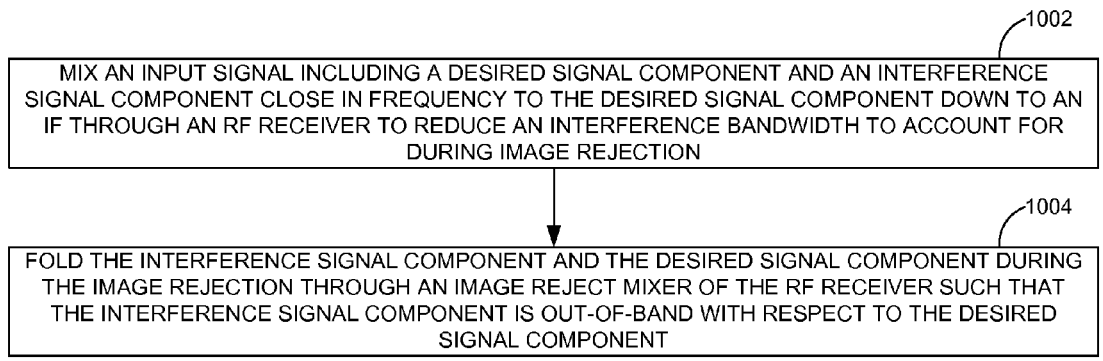
FIG. 10 is a process flow diagram detailing the operations involved in reducing an interference bandwidth during image rejection in an RF receiver, according to one or more embodiments.

FIG. 10 shows a process flow diagram detailing the operations involved in a method of reducing an interference bandwidth during image rejection in an RF receiver (e.g., high band channel receiver 108A, low band channel receiver 108B), according to one or more embodiments. In one or more embodiments, operation 1002 may involve mixing input signal 106 including desired signal component 104 and interference signal component 102 close in frequency to desired signal component 104 down to an Intermediate Frequency (IF) through the RF receiver to reduce an interference bandwidth to account for during image rejection. In one or more embodiments, operation 1004 may then involve folding interference signal component 102 and desired signal component 104 during the image rejection through image reject mixer 202 (A,B) of the RF receiver such that interference signal component 102 is out-of-band with respect to desired signal component 104.

Although the present embodiments has been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium).

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A method comprising:
providing a highly linear front end in a Radio Frequency (RF) receiver;
wherein the RF receiver is at least one of a high band channel receiver and a low band channel receiver;
wherein the high band channel receiver is configured to receive a Global Positioning System (GPS) carrier signal $L_1$ carrying a standard positioning code along with navigational data, and the low band channel receiver is configured to receive a GPS carrier signal $L_2$ carrying a precision positioning code, each of the high band channel receiver and the low band channel receiver being capable of receiving $L_1$ and $L_2$ respectively with precision and mitigating ionospheric effects from $L_1$ and $L_2$ respectively, $L_1$ having a higher frequency than $L_2$;
implementing a 12 Effective Number of Bits (ENOB) Analog to Digital Converter (ADC) circuit in the RF receiver along with the provided highly linear front end to enable the RF receiver have a dynamic range of at least 60 dB;
sampling, through the 12 ENOB ADC circuit, at a frequency having harmonics that do not coincide with a desired signal component of an input signal of the RF receiver to eliminate spurs within a data bandwidth of the RF receiver, the input signal including the desired signal component and an interference signal component, and the interference signal component having a power level at least 60 dB higher than that of the desired signal component;
simultaneously accommodating the desired signal component and the interference signal component in the RF receiver based on the at least 60 dB dynamic range of the RF receiver and the 12 ENOB ADC circuit provided through the highly linear front end and the 12 ENOB ADC circuit; and
placing the interference signal component at an image frequency location of an image reject mixer at an IF stage of the RF receiver to reduce a power level of the simultaneously accommodated interference signal component.

2. The method of claim 1,
wherein the RF receiver includes an RF mixer and the image reject mixer in a double superheterodyne configuration thereof, and
wherein the method further comprises providing a clock signal to the 12 ENOB ADC circuit divided down in frequency from an output of a Voltage Controlled Oscillator (VCO) providing a local oscillator reference signal to the image reject mixer to reduce a jitter thereof.

3. The method of claim 2, further comprising at least one of:
controlling a gain of at least one of a Variable Gain Amplifier (VGA) utilized to amplify an output of the RF mixer and a VGA utilized to amplify an output of the image reject mixer through an Automatic Gain Control (AGC) circuit provided in a feedback path of the image reject mixer.

4. The method of claim 1, comprising implementing a Hartley architecture of the image reject mixer.

5. A method comprising:
providing an RF receiver having a dynamic range of at least 60 dB to simultaneously accommodate a desired signal component of an input signal and an interference signal component thereof, the interference signal component having a power level at least 60 dB higher than that of the desired signal component, the RF receiver having a double superheterodyne configuration comprising an RF mixer and an image reject mixer, and the provision of the RF receiver having the dynamic range of at least 60 dB further comprising:
providing a highly linear front end in the RF receiver, implementing a 12 ENOB ADC circuit in the RF receiver, and
sampling, through the 12 ENOB ADC circuit, at a frequency having harmonics that do not coincide with the desired signal component to eliminate spurs within a data bandwidth of the RF receiver; and
selecting an image frequency of the image reject mixer to coincide with a frequency of the interference signal component to enable cancelation thereof through the image reject mixer while having a capability to receive the desired signal component;
wherein the RF receiver is at least one of a high band channel receiver and a low band channel receiver;
wherein the high band channel receiver is configured to receive a Global Positioning System (GPS) carrier signal $L_1$ carrying a standard positioning code along with navigational data and the low band channel receiver is configured to receive a GPS carrier signal $L_2$ carrying a precision positioning code, each of the high band channel receiver and the low band channel receiver being capable of receiving $L_1$ and $L_2$ respectively with precision and mitigating ionospheric effects from $L_1$ and $L_2$ respectively, $L_1$ having a higher frequency than $L_2$.

6. The method of claim 5, further comprising providing a clock signal to the 12 ENOB ADC circuit divided down in frequency from an output of a VCO providing a local oscillator reference signal to the image reject mixer to reduce a jitter thereof.

7. The method of claim 5, further comprising at least one of:
controlling a gain of at least one of a VGA utilized to amplify an output of the RF mixer and a VGA utilized to amplify an output of the image reject mixer through an AGC circuit provided in a feedback path of the image reject mixer.

8. The method of claim 5, comprising implementing a Hartley architecture of the image reject mixer.

9. A method comprising:
implementing a 12 ENOB ADC circuit in an RF receiver having a double superheterodyne configuration comprising an RF mixer and an image reject mixer;
wherein the RF receiver is at least one of a high band channel receiver and a low band channel receiver;
wherein the high band channel receiver is configured to receive a Global Positioning System (GPS) carrier signal $L_1$ carrying a standard positioning code along with navigational data and the low band channel receiver is configured to receive a GPS carrier signal $L_2$ carrying a precision positioning code, each of the high band channel receiver and the low band channel receiver being capable of receiving $L_1$ and $L_2$ respectively with precision and mitigating ionospheric effects from $L_1$ and $L_2$ respectively, $L_1$ having a higher frequency than $L_2$;

utilizing an output of a VCO to generate a local oscillator reference signal to the image reject mixer;
providing a clock signal to the 12 ENOB ADC circuit divided down in frequency from the output of the VCO providing the local oscillator reference signal to the image reject mixer to reduce a jitter thereof;
providing a highly linear front end in the RF receiver along with the 12 ENOB ADC circuit to enable the RF receiver have a dynamic range of at least 60 dB;
sampling, through the 12 ENOB ADC circuit, at a frequency having harmonics that do not coincide with a desired signal component of an input signal of the RF receiver to eliminate spurs within a data bandwidth of the RF receiver, the input signal including the desired signal component and an interference signal component, and the interference signal component having a power level at least 60 dB higher than that of the desired signal component;
simultaneously accommodating the desired signal component and the interference signal component in the RF receiver based on the at least 60 dB dynamic range of the RF receiver and the 12 ENOB ADC circuit provided through the highly linear front end and the 12 ENOB ADC circuit; and
placing the interference signal component at an image frequency location of the image reject mixer at an IF stage the RF receiver to reduce a power level of the simultaneously accommodated interference signal component.

10. An integrated circuit (IC) chip comprising:
a high band channel receiver configured to receive a Global Positioning System (GPS) carrier signal $L_1$ carrying a standard positioning code along with navigational data; and
a low band channel receiver configured to receive a GPS carrier signal $L_2$ carrying a precision positioning code, each of the high band channel receiver and the low band channel receiver being capable of receiving $L_1$ and $L_2$ respectively with precision and mitigating ionospheric effects from $L_1$ and $L_2$ respectively, $L_1$ having a higher frequency than $L_2$, and the each of the high band channel receiver and the low band channel receiver comprising:
a highly linear front end; and
a 12 ENOB ADC circuit along with the highly linear front end to enable the each of the high band channel receiver and the low band channel receiver have a dynamic range of at least 60 dB, a sampling frequency of the 12 ENOB ADC circuit having harmonics that do not coincide with a desired signal component of each of $L_1$ and $L_2$ to eliminate spurs within a data bandwidth of the each of the high band channel receiver and the low band channel receiver, the each of $L_1$ and $L_2$ additionally including an interference signal component having a power level at least 60 dB higher than that of the desired signal component,
wherein the each of the high band channel receiver and the low band channel receiver is configured to simultaneously accommodate the desired signal component and the interference signal component of the each of $L_1$ and $L_2$ based on the at least 60 dB dynamic range of the each of the high band channel receiver and the low band channel receiver and the 12 ENOB ADC circuit provided through the highly linear front end and the 12 ENOB ADC circuit, and wherein the each of the high band channel receiver and the low band channel receiver comprises an image reject mixer at an IF stage thereof at whose image frequency location the simultaneously accommodated interference signal component is placed to reduce a power level thereof.

11. The IC chip of claim 10,
wherein the each of the high band channel receiver and the low band channel receiver includes an RF mixer and the image reject mixer in a double superheterodyne configuration thereof.

12. The IC chip of claim 10, wherein the image reject mixer is based on a Hartley architecture.

13. An in-band cancellation system comprising:
an RF receiver;
wherein the RF receiver is at least one of a high band channel receiver and a low band channel receiver;
wherein the high band channel receiver is configured to receive a Global Positioning System (GPS) carrier signal $L_1$ carrying a standard positioning code along with navigational data, and the low band channel receiver configured to receive a GPS carrier signal $L_2$ carrying a precision positioning code, each of the high band channel receiver and the low band channel receiver being capable of receiving $L_1$ and $L_2$ respectively with precision and mitigating ionospheric effects from $L_1$ and $L_2$ respectively, $L_1$ having a higher frequency than $L_2$;
a channel emulator to emulate a channel between a transmitter of an input signal and the RF receiver, the input signal including an undesired in-band signal component and a desired signal component, and the channel emulator having a sampled version of the undesired in-band signal component fed as an input thereto; and
an adaptive filter having parameters capable of being varied based on the input signal being fed as a reference input thereto to vary a frequency of a correlated reference signal filtered therethrough, the correlated reference signal being generated based on a correlation between the input signal and the undesired in-band signal component,
wherein the filtered signal from the adaptive filter is configured to be subtracted from an output of the channel emulator to remove the in-band signal component from the input signal.

14. A method comprising:
mixing an input signal including a desired signal component and an interference signal component close in frequency to the desired signal component down to an Intermediate Frequency (IF) through an RF receiver to reduce an interference bandwidth to account for during image rejection; and
folding the interference signal component and the desired signal component during the image rejection through an image reject mixer of the RF receiver such that the interference signal component is out-of-band with respect to the desired signal component;
wherein the RF receiver is at least one of a high band channel receiver and a low band channel receiver;
wherein the high band channel receiver is configured to receive a Global Positioning System (GPS) carrier signal $L_1$ carrying a standard positioning code along with navigational data, and the low band channel receiver is configured to receive a GPS carrier signal $L_2$ carrying a precision positioning code, each of the high band channel receiver and the low band channel receiver being capable of receiving $L_1$ and $L_2$ respectively with precision and mitigating ionospheric effects from $L_1$ and $L_2$ respectively, $L_1$ having a higher frequency than $L_2$.

15. The method of claim 14, further comprising:
providing a highly linear front end in the RF receiver;
implementing a high ENOB ADC circuit in the RF receiver;
sampling, through the high ENOB ADC circuit, at a frequency having harmonics that do not coincide with the desired signal component of the input signal of the RF receiver to eliminate spurs within a data bandwidth of the RF receiver; and
simultaneously accommodating the desired signal component and the interference signal component in the RF receiver based on an increased dynamic range of the RF receiver and the high ENOB ADC circuit provided through the highly linear front end and the high ENOB ADC circuit.

16. The method of claim 14,
wherein the RF receiver includes an RF mixer and the image reject mixer in a double superheterodyne configuration thereof, and
wherein the method further comprises providing a clock signal to the high ENOB ADC circuit divided down in frequency from an output of a VCO providing a local oscillator reference signal to the image reject mixer to reduce a jitter thereof.

17. The method of claim 16, further comprising at least one of:
controlling a gain of at least one of a VGA utilized to amplify an output of the RF mixer and a VGA utilized to amplify an output of the image reject mixer through an AGC circuit provided in a feedback path of the image reject mixer.

18. A wireless system comprising:
a wireless transmitter; and
a wireless RF receiver configured to receive an input signal from the wireless transmitter, the input signal including a desired signal component and an interference signal component, the interference signal component having a power level at least 60 dB higher than that of the desired signal component, and the wireless RF receiver comprising:
a highly linear front end, and
a 12 ENOB ADC circuit along with the highly linear front end to enable the wireless RF receiver have a dynamic range of at least 60 dB, a sampling frequency of the 12 ENOB ADC circuit having harmonics that do not coincide with the desired signal component to eliminate spurs within a data bandwidth of the wireless RF receiver;
wherein the wireless RF receiver is configured to simultaneously accommodate the desired signal component and the interference signal component based on an increased dynamic range of the wireless RF receiver and the 12 ENOB ADC circuit provided through the highly linear front end and the 12 ENOB ADC circuit;
wherein the wireless RF receiver further comprises an image reject mixer at an IF stage thereof at whose image frequency location the simultaneously accommodated interference signal component is placed to reduce a power level thereof;
wherein the wireless RF receiver is at least one of a high band wireless RF receiver and a low band wireless RF receiver; and wherein the high band channel receiver is configured to receive a Global Positioning System (GPS) carrier signal $L_1$ carrying a standard positioning code along with navigational data, and the low band channel receiver is configured to receive a GPS carrier signal $L_2$ carrying a precision positioning code, each of the high band channel receiver and the low band channel receiver being capable of receiving $L_1$ and $L_2$ respectively with precision and mitigating ionospheric effects from $L_1$ and $L_2$ respectively, $L_1$ having a higher frequency than $L_2$.

19. The wireless system of claim 18, wherein the wireless RF receiver includes an RF mixer and the image reject mixer in a double superheterodyne configuration thereof, and wherein a clock signal to the 12 ENOB ADC circuit is divided down in frequency from an output of a VCO providing a local oscillator reference signal to the image reject mixer to reduce a jitter thereof.

20. The wireless system of claim 19, further comprising:

an AGC circuit provided in a feedback path of the image reject mixer to control a gain of at least one of a VGA utilized to amplify an output of the RF mixer and a VGA utilized to amplify an output of the image reject mixer.

21. The wireless system of claim 18, wherein the image reject mixer is based on a Hartley architecture.

22. The wireless system of claim 18, wherein the wireless RF receiver is a GPS receiver.

23. The wireless system of claim 18, wherein the wireless system is one of a cellular transceiver and a Wi-Fi transceiver.

* * * * *